(12) United States Patent
Hayashi et al.

(10) Patent No.: US 7,423,382 B2
(45) Date of Patent: Sep. 9, 2008

(54) LIGHT-EMITTING BODY, LIGHT EMITTING DEVICE AND LIGHT-EMITTING DISPLAY

(75) Inventors: Kazuhiko Hayashi, Tokyo (JP); Atsushi Oda, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 639 days.

(21) Appl. No.: 10/956,036

(22) Filed: Oct. 4, 2004

(65) Prior Publication Data

US 2005/0067947 A1    Mar. 31, 2005

(51) Int. Cl.
*H01J 1/62* (2006.01)
(52) U.S. Cl. .................... 315/169.3; 315/169.2
(58) Field of Classification Search ......... 313/503–504, 313/506, 509; 315/169.3; 257/59, 72
See application file for complete search history.

(56) References Cited

U.S. PATENT DOCUMENTS

| | | | |
|---|---|---|---|
| 5,396,149 A | 3/1995 | Kwon | 313/486 |
| 5,557,115 A | 9/1996 | Shakuda | 257/81 |
| 6,084,579 A | 7/2000 | Hirano | |
| 6,525,467 B1 | 2/2003 | Eida et al. | 313/506 |
| 6,538,374 B2* | 3/2003 | Hosokawa | 313/504 |
| 6,559,594 B2 | 5/2003 | Fukunaga et al. | 313/506 |
| 6,830,494 B1* | 12/2004 | Yamazaki et al. | 445/24 |
| 6,888,304 B2* | 5/2005 | Sato | 313/498 |
| 2001/0011868 A1 | 8/2001 | Fukunaga et al. | 313/506 |
| 2001/0024083 A1 | 9/2001 | Yamazaki et al. | 313/483 |
| 2002/0011783 A1 | 1/2002 | Hosokawa | 313/504 |
| 2002/0021266 A1 | 2/2002 | Koyama et al. | 345/76 |
| 2002/0033664 A1 | 3/2002 | Kobayashi | 313/504 |

FOREIGN PATENT DOCUMENTS

| | | |
|---|---|---|
| EP | 0 650 955 A1 | 10/1994 |
| JP | 63-264692 | 11/1988 |
| JP | 63-295695 | 12/1988 |
| JP | 2-191694 | 7/1990 |
| JP | 3-792 | 1/1991 |
| JP | 3-255190 | 11/1991 |
| JP | 5-70733 | 3/1993 |
| JP | 5-234681 | 9/1993 |
| JP | 5-239455 | 9/1993 |
| JP | 5-258859 | 10/1993 |
| JP | 5-299174 | 11/1993 |
| JP | 6-45074 | 2/1994 |
| JP | 6-215874 | 8/1994 |
| JP | 7-126225 | 5/1995 |

(Continued)

*Primary Examiner*—Douglas W. Owens
*Assistant Examiner*—Chuc Tran
(74) *Attorney, Agent, or Firm*—H.C. Park & Associates, PLC

(57) ABSTRACT

A light-emitting body of the present invention includes an anode and a cathode at least partly facing the anode with the intermediary of a light-emitting material layer. An auxiliary electrode is formed, via an insulation layer, on the surface of the light-emitting body opposite to the surface where the anode faces the cathode via the light-emitting material layer. The cathode can be formed of a material that corrodes little. The light-emitting body therefore extends the life of a light-emitting device and therefore the life of a light-emitting display.

8 Claims, 22 Drawing Sheets

FOREIGN PATENT DOCUMENTS

| | | |
|---|---|---|
| JP | 7-126226 | 5/1995 |
| JP | 8-12600 | 1/1996 |
| JP | 8-12969 | 1/1996 |
| JP | 8-100172 | 4/1996 |
| JP | 8-264278 | 10/1996 |
| JP | 9-35871 | 2/1997 |
| JP | 11-121177 | 4/1999 |
| JP | 2000-040594 | 2/2000 |
| JP | 2000-252550 | 9/2000 |
| JP | 2001-126887 | 5/2001 |
| JP | 2002-164166 | 6/2002 |

\* cited by examiner 3a 3a 3a 3a 3a 3a 3a 3a 3a 3a

FIG. 35

| LIGHT-EMITTING MATERIAL LAYER 1 | BENZOQUINOLYL BERYLLIUM COMPLEX |
|---|---|
| NON-MAGNETIC LAYER 2 | Si NITRIDE |
| CATHODE 3a | Au |
| AUXILIARY ELECTRODE 4a | Au |
| ANODE 5a | ITO |
| SUBSTRATE 6 | ALKALI-FREE GLASS |

FIG. 36

| LIGHT-EMITTING MATERIAL LAYER 1 | BENZOQUINOLYL BERYLLIUM COMPLEX |
|---|---|
| NON-MAGNETIC LAYER 2 | Si NITRIDE |
| CATHODE 3a | Al |
| AUXILIARY ELECTRODE 4a | Au |
| ANODE 5a | ITO |
| SUBSTRATE 6 | ALKALI-FREE GLASS |

FIG. 37

| | |
|---|---|
| LIGHT-EMITTING MATERIAL LAYER 1 | BENZOQUINOLYL BERYLLIUM COMPLEX |
| NON-MAGNETIC LAYER 2 | Si NITRIDE |
| CATHODE 3ℓ | Al Li |
| AUXILIARY ELECTRODE 4ℓ | Au |
| ANODE 5ℓ | Al |
| SUBSTRATE 6 | ALKALI-FREE GLASS |

FIG. 38

| | |
|---|---|
| LIGHT-EMITTING MATERIAL LAYER 1 | COPPER PHTHALOCYANINE |
| NON-MAGNETIC LAYER 2 | Si NITRIDE |
| CATHODE 3ℓ | Al Li |
| AUXILIARY ELECTRODE 4ℓ | Au |
| ANODE 5ℓ | ITO |
| SUBSTRATE 6 | ALKALI-FREE GLASS |

LIGHT-EMITTING BODY, LIGHT EMITTING DEVICE AND LIGHT-EMITTING DISPLAY

CROSS REFERENCE TO RELATED APPLICATIONS

This application is related to and claims the priority of U.S. patent application Ser. No. 10/141,649, which in turn claims priority to Japanese Priority Application No. 2001-139987. Each of those parent applications are hereby incorporated fully by reference in their entireties.

BACKGROUND OF THE INVENTION

1. Field of the Invention

The present invention relates to a light-emitting body including an auxiliary electrode for feeding an assist voltage, a light-emitting device, and a light-emitting display.

2. Description of the Background Art

Light-emitting bodies for use in a display are generally classified into field emission devices and EL (Electro Luminescent) devices. An EL device is implemented as an organic EL device whose light-emitting layer is formed of an organic material or as an inorganic EL device whose light emitting layer is formed of an inorganic material.

An organic EL device is made up of an anode, a cathode, and an ultrathin-film organic EL layer intervening between the anode and the cathode and formed of an organic light-emitting compound. When a voltage is applied between the anode and the cathode, holes and electrons are respectively injected from the anode and cathode into the organic EL layer and recombined therein. The resulting energy excites the molecules of the organic compound constituting the organic EL layer. The EL layer emits light when the excited molecules are deactivated to the ground level.

More specifically, the organic EL layer includes at least one of three different organic layers generally referred to as an emission layer, a hole transport layer, and an electrode transport layer, respectively, in the form of a single layer or a laminate. The emission layer emits light due to the recombination of holes and electrons. The hole transport layer allows holes to be easily injected therein, but obstructs the migration of electrons. Conversely, the electron transport layer allows electrons to be easily injected therein, but obstructs the migration of holes.

An organic EL device now attracting increasing attention includes a transparent electrode (hole injection electrode or anode) formed of, e.g., indium tin oxide (ITO). Triphenyldiamine (TPD) or similar hole injecting material is deposited on the transparent electrode by evaporation, forming a thin film. An aluminum quinolinole complex (Alq3) or similar fluorescent material is stacked on the above thin film to form an emission layer. Further, a metal electrode with a small work function (electron injection electrode or cathode) implemented by, e.g., AgMg is stacked on the emission layer. This kind of organic EL device attains luminance as high as several ten thousand candelas for a square millimeter for a low voltage around 10 V and is expected to desirably implement electric parts and displays for household appliances and vehicles.

More specifically, the organic layers included in the organic EL device each are sandwiched between a scanning (common line) electrode and a data (segment line) electrode and formed on the transparent substrate, e.g., glass substrate. The scanning electrode and data electrode play the role of the electron injection electrode and hole injection electrode, respectively. Displays using such organic EL devices are classified into a matrix display and a segment display. A matrix display causes scanning electrodes and data electrodes arranged in a matrix to display dots (pixels) for thereby displaying, e.g., an image or characters in the form of a dot matrix. A segment display displays, e.g., an image with independent display segments identical in size and configuration.

The segment display is capable of driving the display segments one by one with a static drive system. In this respect, the matrix display uses a dynamic drive system for driving the scanning lines and data lines by time division.

A first type of light-emitting body constituting the light-emitting portion of an organic EL device is implemented as a laminate of a transparent substrate, a transparent electrode, a light-emitting material layer, and a metal electrode. In this type of light-emitting body, light issuing from the emission layer is sequentially transmitted through the transparent electrode and transparent substrate in this order. A second type of light-emitting body is a laminate of a substrate, metal electrode, a light-emitting material layer, and a transparent layer. In this type of light-emitting body, light issuing from the emission layer is transmitted through the transparent electrode and then output via a film opposite to the substrate. The first type of light-emitting body is disclosed in, e.g., C. W. Tang et al. "Organic electroluminescent diodes", Appl. Phys. Lett., 51 (12), 21 Sep. 1987, pp. 913-915. The second type of light-emitting body is disclosed in, e.g., D. R. Gaigent et al. "Conjugated polymer light-emitting diodes on silicon substrates", Appl. Phys. Lett., 65 (21), 21 Nov. 1994, pp. 2636-2638.

It has been customary with the organic EL device to use natural injection based on a difference between the work function of the anode and that of the light-emitting material layer (hole injection) or between the work function of the cathode and that of the light-emitting material layer (electron injection). More specifically, holes are injected from the material with a great work function into the material with a small work function while electrons are injected from the latter into the former. In this sense, the anode should preferably be formed of a material with a work function as great as possible relative to the emission layer while the cathode should preferably be formed of a material with a work function as small as possible.

A typical light-emitting device outputs light issuing from the light-emitting material via either one of the anode and cathode. However, from the transparency and conductivity standpoint, materials applicable to the transparent electrode at the present stage of development are limited to ITO, an In oxide and Zn oxide mixture and so forth having a work function as small as about 4 eV. Therefore, when the transparent electrode is used for the cathode, holes cannot be injected from the transparent electrode into the light-emitting material layer unless the work function of the latter is smaller than the work function of the former. As a result, the cathode for injecting electrons in the light-emitting material layer must, of course, be formed of a material with an even smaller work function.

A small work function, however, means small Fermi-level energy and therefore causes atoms to lose electrons when subjected to a low voltage. Such electrons can therefore be easily combined with other atoms, i.e. highly reactive. Consequently, if oxygen and hydrogen, for example, exist around the cathode material, then chemical reaction occurs therebetween, producing an oxide of the cathode material or similar compound. This compound obstructs the migration of electrons from the cathode to the light-emitting material layer and thereby lowers luminance.

Technologies relating to the present invention are also disclosed in, e.g., Japanese Patent Laid-Open Publication Nos. 06-045074, 08-264278, 09-035871, 63-264692, 08-012600, 63-295695, 05-234681, 05-239455, 08-012969, 03-255190, 05-070733, 06-215874, 02-191694, 03-000792, 05-299174, 07-126225, 07-126226, 08-100172 and 05-258859 as well as in EP 0 650 955 A1.

SUMMARY OF THE INVENTION

It is an object of the present invention to provide a light-emitting body allowing holes to be injected from an anode into a light-emitting material layer even if part of the light-emitting material layer contacting the anode has a work function equal to or greater than that of the anode, a light-emitting device, and a light-emitting display.

It is another object of the present invention to provide a light-emitting body allowing holes to be more efficiently injected from an anode into a light-emitting material layer if the latter has a smaller work function than the former, a light-emitting device, and a light-emitting display.

It is still another object of the present invention to provide a light-emitting body allowing electrons to be injected from a cathode into a light-emitting material layer even if part of the light-emitting material layer contacting the cathode has a work function equal to or greater than that of the cathode, a light-emitting device, and a light-emitting display.

It is yet another object of the present invention to provide a light-emitting body allowing electrons to be more efficiently injected from a cathode into a light-emitting material layer if the latter has a smaller work function that the former, a light-emitting device, and a light-emitting display.

It is a further object of the present invention to provide a light-emitting body allowing, based on a broader range of materials applicable to a light-emitting material layer and a cathode and implemented by the above improvements, the cathode to be formed of a material that corrodes little, thereby improving reliability and luminance, a light-emitting device, and a light-emitting display.

In accordance with the present invention, a light-emitting body includes an anode and a cathode at least partly facing the anode with the intermediary of a light-emitting material layer. An auxiliary electrode is formed, via an insulation layer, on the surface of the light-emitting body opposite to a surface where the anode faces the cathode via the light-emitting material layer. The anode and cathode may be replaced with each other.

Also, in accordance with the present invention, a light-emitting device includes the light-emitting body having the structure described above. A current feeding device is electrically connected to either one of the anode and cathode for feeding a current to the light-emitting material layer. A voltage source is electrically connected to the auxiliary electrode for applying a voltage to the light-emitting material layer.

Further, in accordance with the present invention, a light-emitting display includes a plurality of switching devices each including a light-emitting body having the structure described above. A current feeding device is electrically connected to either one of the anode and cathode for feeding a current to the light-emitting material layer. A voltage source is electrically connected to the auxiliary electrode for applying a voltage to the light-emitting material layer. A switching device is connected to the current feeding device for causing it to selectively feed the current to the light-emitting material layer. A line for feeding the current to the current feeding device and a line for delivering ON/OFF voltage information to the switching device are arranged. A plurality of lines for feeding the current and a plurality of lines for delivering ON/OFF voltage information are arranged in a matrix.

BRIEF DESCRIPTION OF THE DRAWINGS

The above and other objects, features and advantages of the present invention will become more apparent from the following detailed description taken with the accompanying drawings in which:

FIGS. 35 through 38 are tables respectively listing substances applied to a first to a fourth example of the light-emitting device of the present invention.

DESCRIPTION OF THE PREFERRED EMBODIMENTS

To better understand the present invention, terms to repeatedly appear in the following description will be defined first. A light-emitting body refers to a structure basically made up of electrodes including a cathode, an anode and an auxiliary electrode and a light-emitting material layer. The light-emitting material layer includes an emission layer or a stack of the emission layer and layers above and below the emission layer for helping the emission layer emit light. The emission layer refers to a light-emitting layer. A light-emitting body refers to an emission unit including the light-emitting body, a current feeding device for feeding a current to the light-emitting body, and a switching device.

Further, a pixel refers to a minimum unit included in a light-emitting display. While a pixel sometimes refers to the light-emitting device, it sometimes refers to the combination of the light-emitting device, a color filter, and a color converting device. The light-emitting display is configured to display an image in accordance with image information input from the outside.

Figure 1:
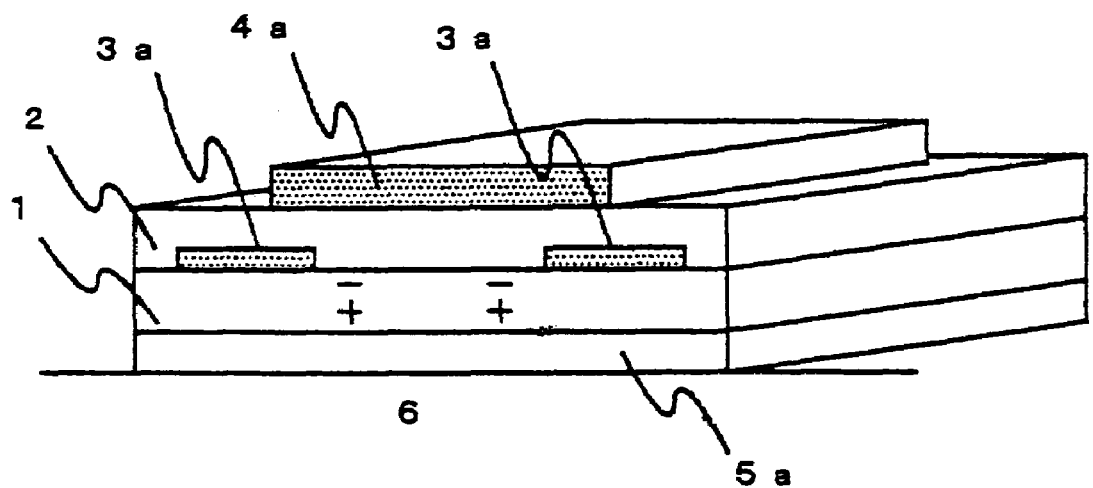
FIG. 1 is an isometric view showing a first embodiment of the light-emitting body in accordance with the present invention.
Figure 2:
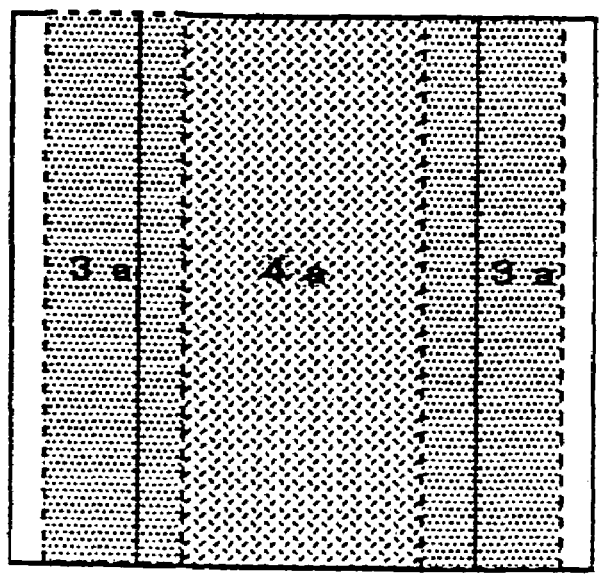
FIG. 2 is a plan view showing the first embodiment.

Referring to FIGS. 1 and 2 of the drawings, a first embodiment of the light emitting body in accordance with the present invention is shown. As shown, the light-emitting body includes a substrate 6 on which an anode 5a is formed. A light-emitting material layer 1, a cathodes 3a, an insulation layer 2 and an auxiliary electrode 4a are sequentially stacked on the anode 5a in this order. A voltage is applied between the anode 5a and the cathodes 3a. A voltage is also applied between the auxiliary electrode 4a and the cathodes 3a in the same direction as the above voltage.

Generally, electrons are easily injected from a material with a small work function into a material with a great work function, but not from the latter into the former. The illustrative embodiment allows electrons to be injected from a material with a great work function into a material with a small work function because of the assist from the voltage applied between the anode 5a and the cathodes 3a. Electrons can therefore be injected from the cathodes 3a into the light-emitting material layer 1 whose work function is smaller than or equal to the work function of the cathodes 3a. This makes it needless to use alkali metal, alkaline earth metal or similar metal having a small work function and easy to corrode for the cathodes 3a.

Further, the assist from the voltage applied between the anode 5a and the cathodes 3a allows more electrons to be injected from a material with a small work function into a material with a great work function. The intensity of light to issue from a light-emitting device is dependent on the amount of recombination of electrons and holes in a light-emitting material layer. The amount of recombination of electrons and holes is, in turn, determined by the smaller one of the amount of electrons and that of holes that can contribute to recombination. Of course, the amount of electrons and that of holes that can contribute to recombination are dependent on the amount of electrons and that of holes injected into a light-emitting material layer. Therefore, in a light-emitting material layer with enough electrons, but short holes, the assist voltage unique to the illustrative embodiment successfully increases the amount of electrons to be injected from the auxiliary electrode 4a into the light-emitting material layer 1, thereby increasing the intensity of light.

Figure 3:
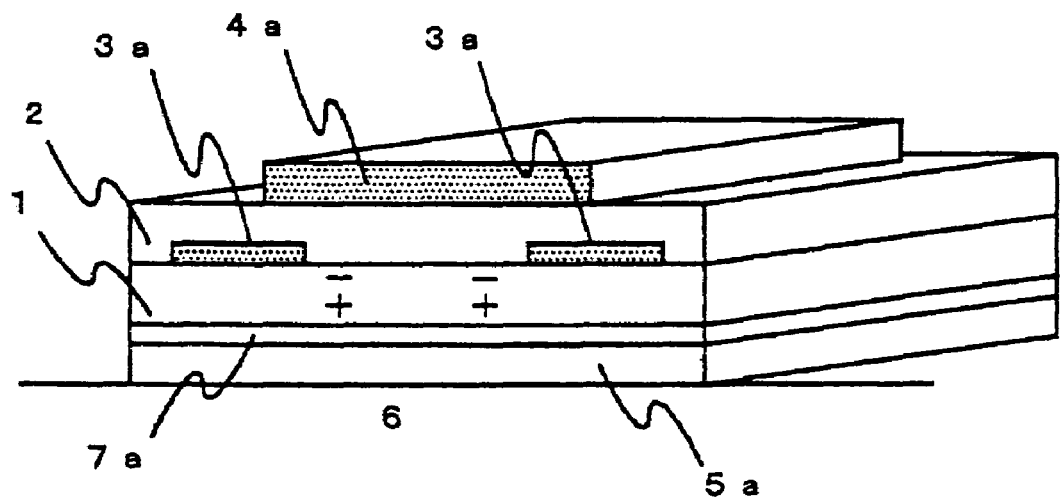
FIG. 3 is an isometric view showing a first modification of the illustrative embodiment.

FIG. 3 shows a first modification of the illustrative embodiment. As shown, an anode buffer layer 7a intervenes between the light-emitting material layer 1 and the anode 5a. The anode buffer layer 7a is formed of a material that transfers holes from the anode 5a to the light-emitting material layer 1, but does not transfer electrons from the latter to the former. This prevents electrons not contributing to light emission from migrating from the light-emitting material layer 1 to the anode 5a, thereby enhancing efficient light emission. The modification, however, needs an extra cost due to the extra step of forming the anode buffer layer 7a.

Figure 4:
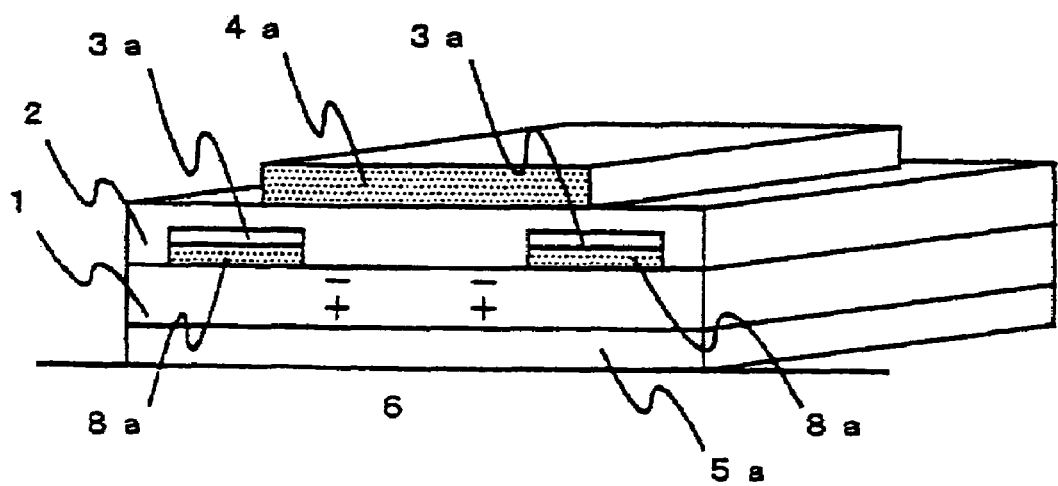
FIG. 4 is an isometric view showing a second modification of the illustrative embodiment.

FIG. 4 shows a second modification of the illustrative embodiment. As shown, cathode buffer layers 8a intervene between the light-emitting material layer 1 and the cathodes 3a. The cathode buffer layers 8a are formed of a material that transfers electrons from the cathodes 3a to the light-emitting material layer 1., but does not transfer holes from the latter to the former. This prevents holes not contributing to light emission from migrating from the light-emitting material layer 1 to the cathodes 3a, thereby enhancing efficient light emission. However, this modification also needs an extra cost due to the extra step of forming the anode buffer layer 7a.

If desired, the anode buffer layer 7a, FIG. 3, and cathode buffer layers 8a, FIG. 4, may be combined, although not shown specifically.

Figure 5:
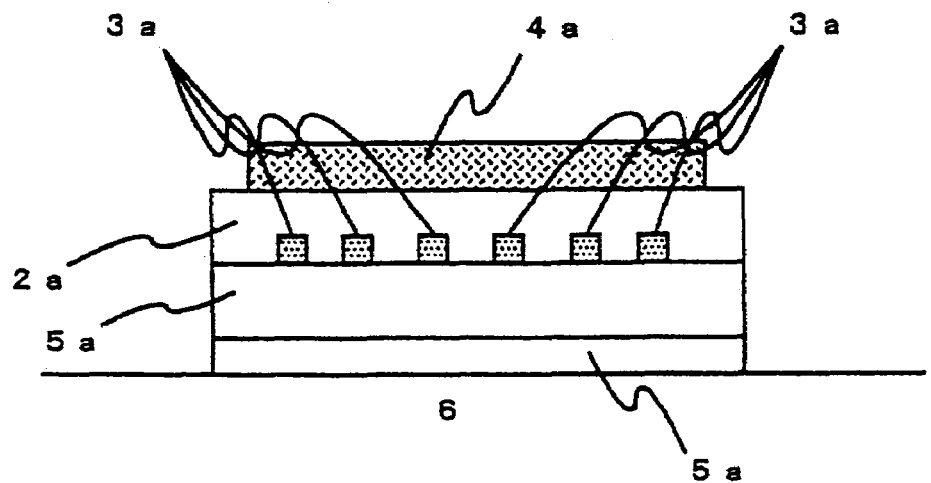
FIG. 5 is a section showing a third modification of the illustrative embodiment.
Figure 6:
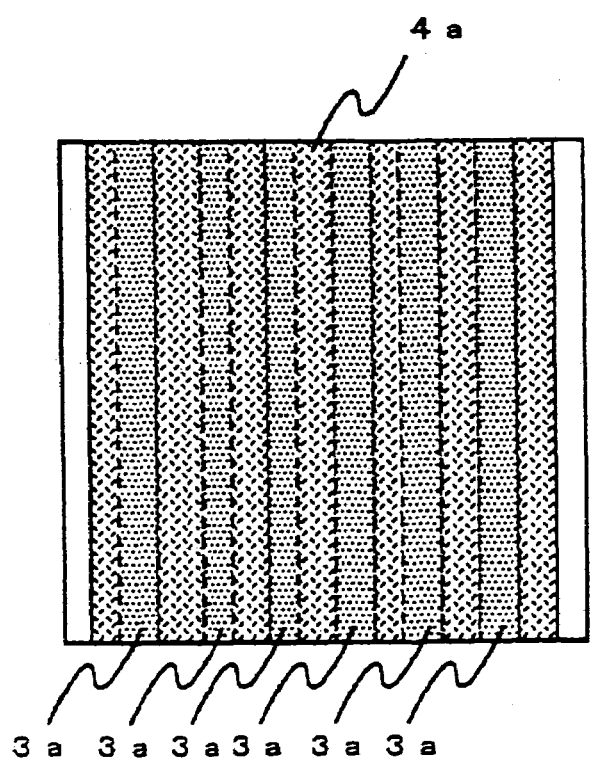
FIG. 6 is a plan view showing the third modification.
Figure 7:
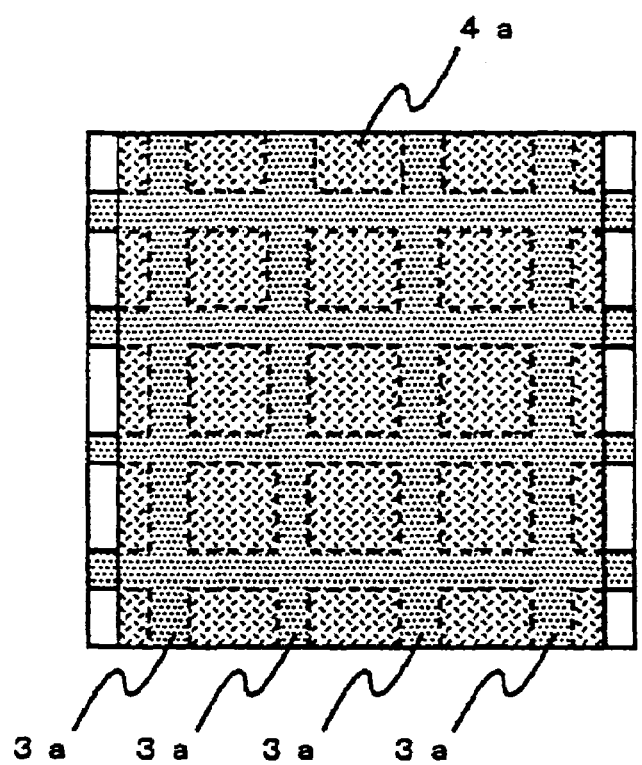
FIG. 7 is a plan view showing a mesh pattern applicable to a cathode included in the third modification.

FIGS. 5 and 6 show a third modification of the illustrative embodiment. As shown, the cathodes 3a are implemented as a narrow, stripe pattern. FIG. 7 shows a mesh pattern that may be substituted for the stripe pattern.

Figure 8:
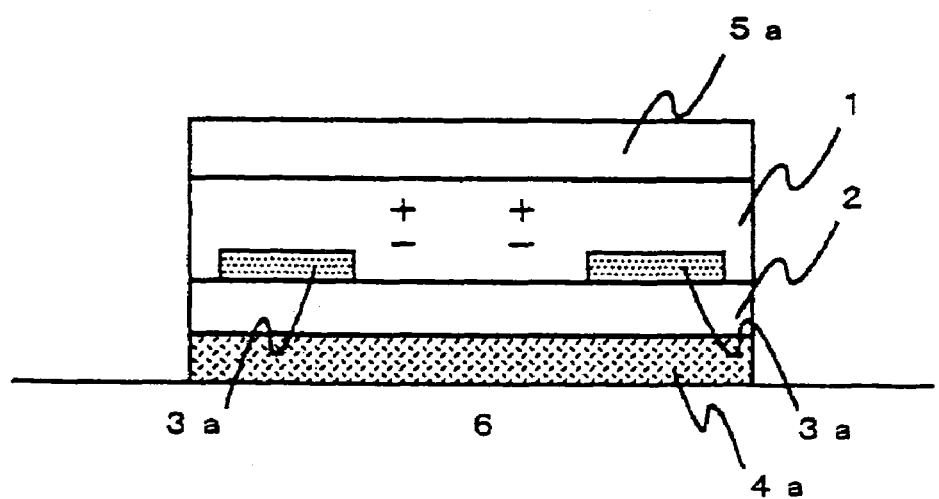
FIG. 8 is a section showing a second embodiment of the light-emitting body in accordance with the present invention.
Figure 9:
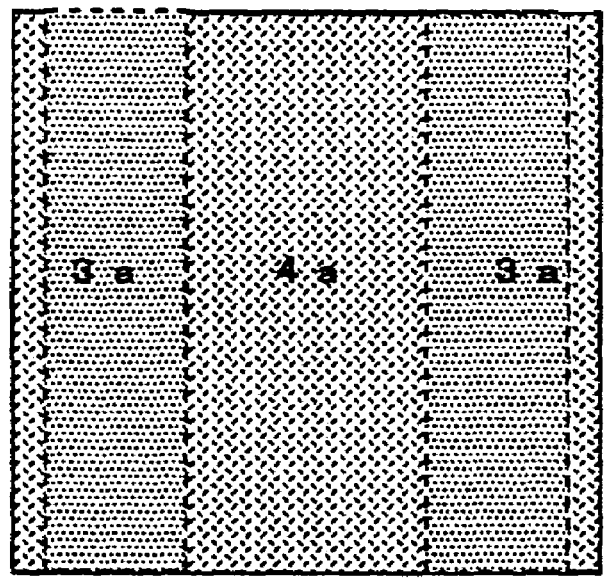
FIG. 9 is a plan view showing the second embodiment.

A second embodiment of the present invention will be described with reference to FIGS. 8 and 9. As shown, the auxiliary electrode 4a is formed on the substrate 6. An insulation layer 2 is formed on the auxiliary electrode 4a. The cathode pattern 3a, light-emitting material layer 1 and anode 5a are sequentially formed on the insulation layer 2 in this order. A voltage is applied between the anode 5a and the cathodes 3a. A voltage is also applied between the auxiliary electrode 4a and the anode 5a in the same direction as the above voltage.

The illustrative embodiment achieves the same advantages as the previously stated embodiment because of the assist from the voltage applied between the anode pattern and the cathode pattern. In addition, the cathodes 3a are patterned before the step of forming the light-emitting material layer 1, so that the layer 1 is free from damage ascribable to the patterning of the cathodes 3a.

Figure 10:
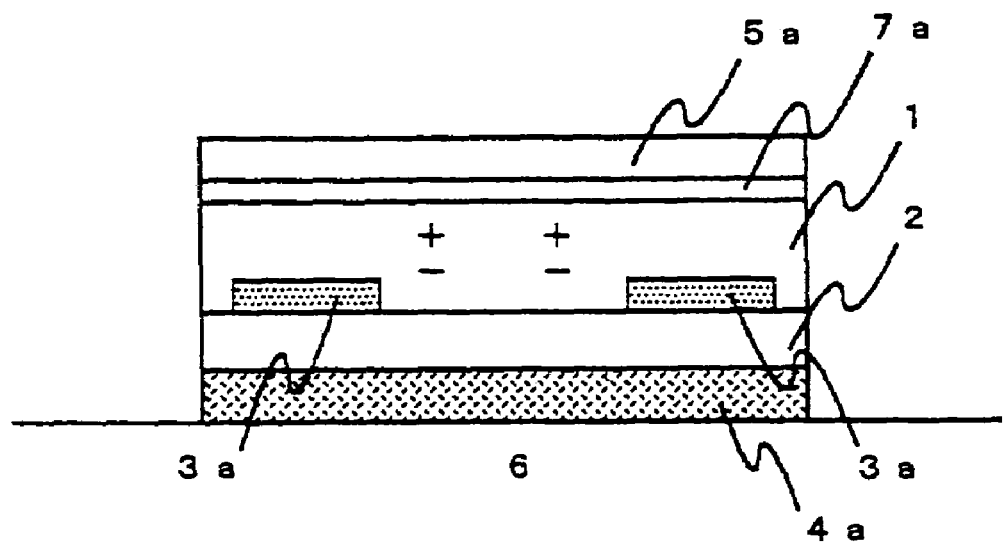
FIG. 10 is a section showing a first modification of the second embodiment.

FIG. 10 shows a first modification of the illustrative embodiment. As shown, the anode buffer layer 7a intervenes between the light-emitting material layer 1 and the anode 5a. The anode buffer layer 7a is formed of a material that transfers holes from the anode 5a to the light-emitting material layer 1, but does not transfer electrons from the latter to the former. This prevents electrons not contributing to light emission from migrating from the light-emitting material layer 1 to the anode 5a, thereby enhancing efficient light emission. The modification, however, needs an extra cost due to the extra step of forming the anode buffer layer 7a.

Figure 11:
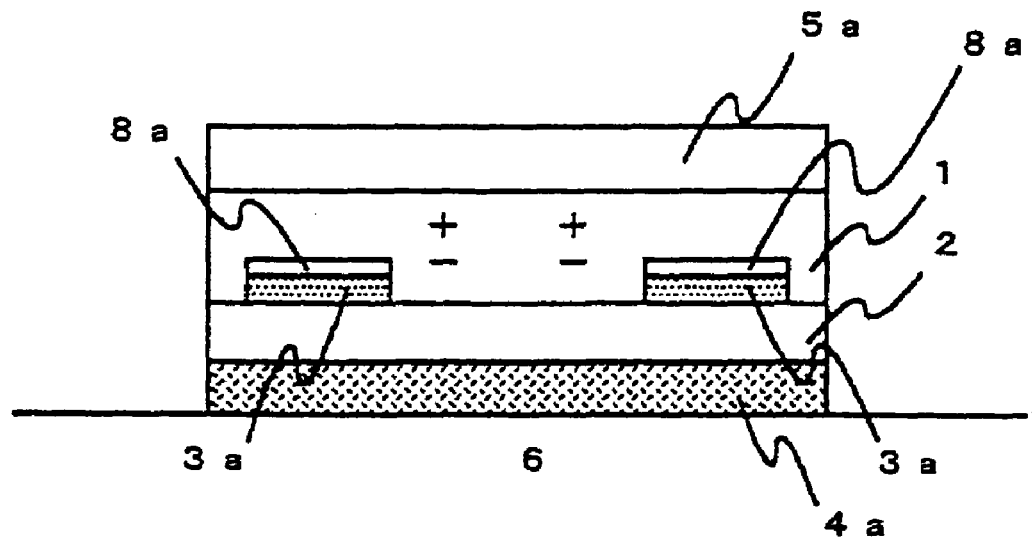
FIG. 11 is a section showing a second modification of the second embodiment.

FIG. 11 shows a second modification of the illustrative embodiment. As shown, the cathode buffer layers 8a intervene between the light-emitting material layer 1 and the cathodes 3a. The cathode buffer layers 8a are formed of a material that transfers electrons from the cathodes 3a to the light-emitting material layer 1, but does not transfer holes from the latter to the former. This prevents holes not contributing to light emission from migrating from the light-emitting material layer 1 to the cathodes 3a, thereby enhancing efficient light emission. However, this modification also needs an extra cost due to the extra step of forming the anode buffer layer 7a.

If desired, the anode buffer layer 7a, FIG. 10, and cathode buffer layers 8a, FIG. 11, may be combined, although not shown specifically.

Figure 12:
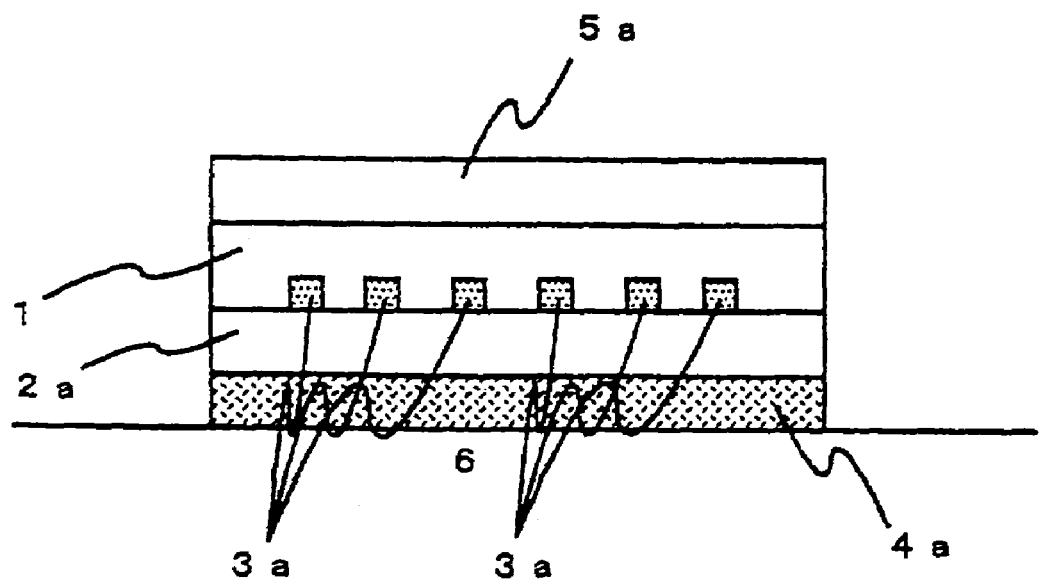
FIG. 12 is a section showing a third modification of the second embodiment.
Figure 13:
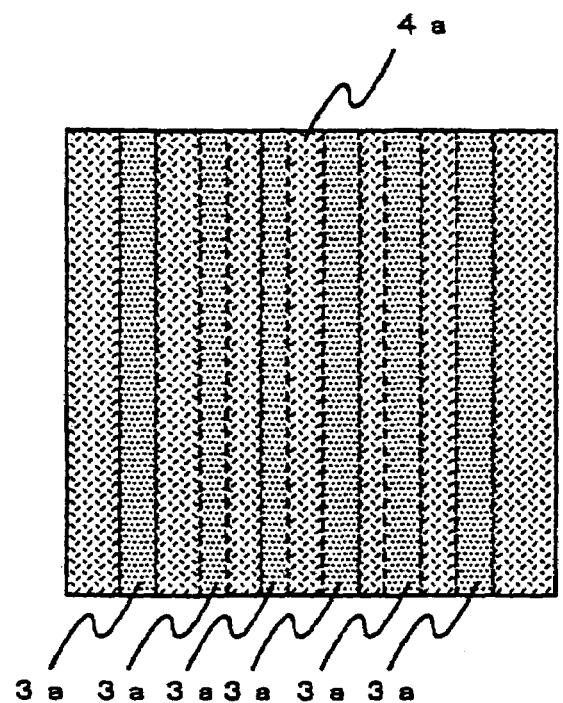
FIG. 13 is a plan view showing the third modification.
Figure 14:
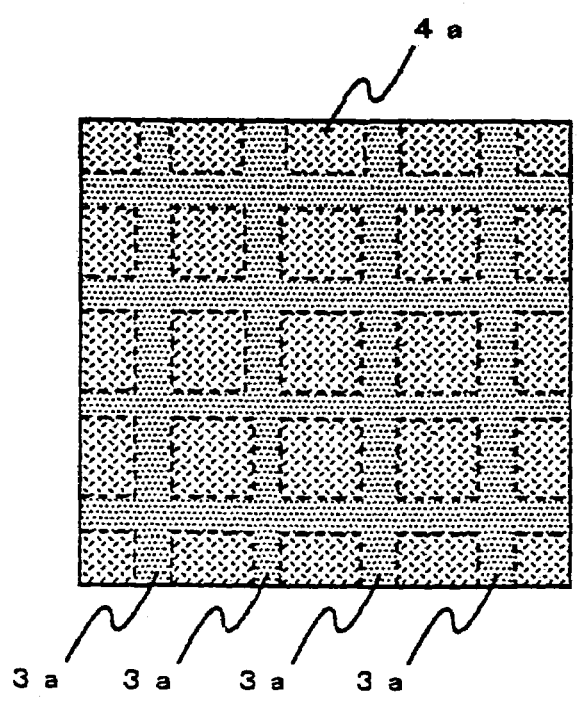
FIG. 14 is a plan view showing a mesh pattern applicable to a cathode included in the third modification.

FIGS. 12 and 13 show a third modification of the illustrative embodiment. As shown, the cathodes 3a are implemented as a narrow, stripe pattern. FIG. 14 shows a mesh pattern that may be substituted for the stripe pattern.

Figure 15:
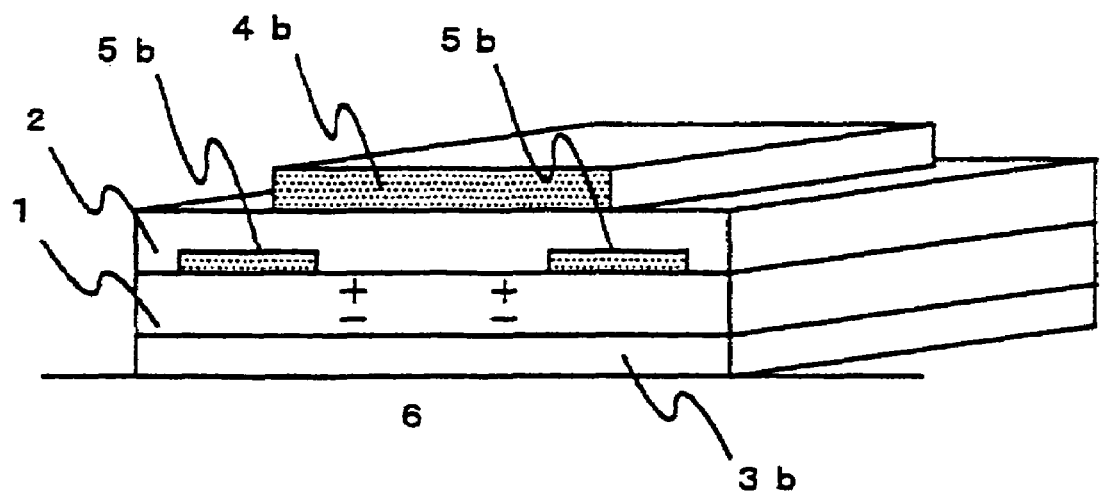
FIG. 15 is an isometric view showing a third embodiment of the present invention.

FIG. 15 shows a third embodiment of the present invention. As shown, a cathode 3b is formed on the substrate 6 while the light emitting layer 1 is formed on the cathode 3b. Anodes 5b, an insulation layer 2 and an auxiliary electrode 4b are sequentially stacked on the light-emitting layer 1 in this order. A voltage is applied between the cathode 3b and the anodes 5b. A voltage is also applied between the auxiliary electrode 4b and the anodes 5b in the same direction as the above voltage.

Generally, holes are easily injected from a material having a great work function into a material having a small work function, but not from the latter into the former. The illustrative embodiment allows holes to be injected from a material with a small work function into a material with a great work function because of the assist from the voltage applied between the cathode 3b and the auxiliary electrode 4b. Holes can therefore be injected from the anodes into the light-emitting material layer whose work function is greater than or equal to the work function of the anodes. This broadens the range of materials applicable to the light-emitting material layer.

Further, the assist from the voltage applied between the cathode 3b and the auxiliary electrode 4b allows more holes to be injected from a material with a great work function into a material with a small work function. The intensity of light to issue from a light-emitting device is dependent on the amount of recombination of electrons and holes in a light-emitting material layer, as stated earlier. The amount of recombination of electrons and holes is, in turn, determined by the smaller one of the amount of electrons and that of holes that can contribute to recombination. Of course, the amount of electrons and that of holes that can contribute to recombination are dependent on the amount of electrons and that of holes injected in a light-emitting material layer. Therefore, in a light-emitting material layer with enough electrons, the assist voltage unique to the illustrative embodiment successfully increases the amount of holes to be injected from the anodes into the light-emitting material layer 1, thereby increasing the intensity of light.

Figure 16:
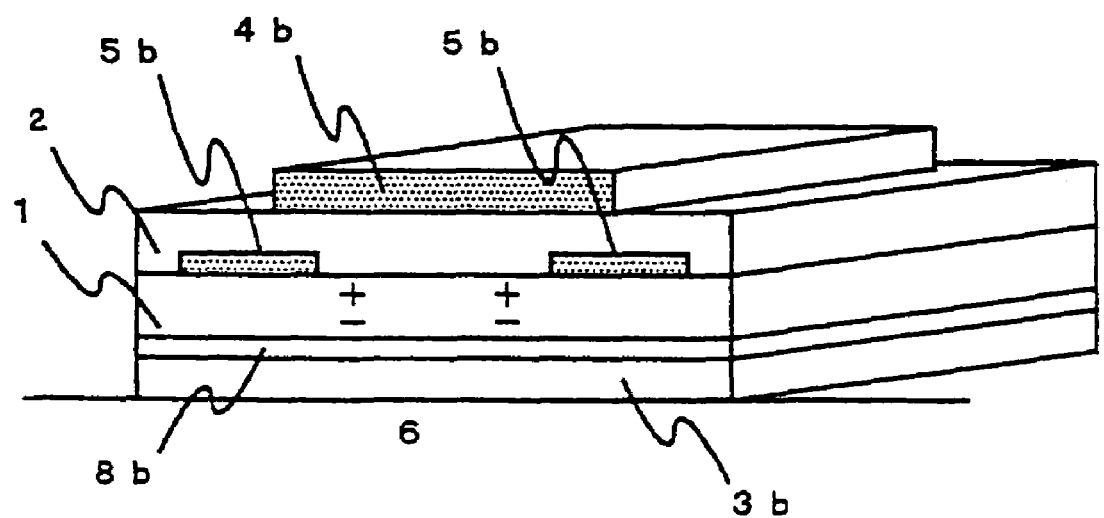
FIG. 16 is an isometric view showing a first modification of the third embodiment.

FIG. 16 shows a first modification of the illustrative embodiment. As shown, a cathode buffer layer 8b intervenes between the light-emitting material layer 1 and the cathode 3b. The cathode buffer layer 8b is formed of a material that transfers electrons from the cathode 3b to the light-emitting material layer 1, but does not transfer holes from the latter to the former. This prevents electrons not contributing to light emission from migrating from the light-emitting material layer 1 to the cathode 3b, thereby enhancing efficient light emission. However, this modification also increases costs due to the extra step of forming the anode buffer layer 8b.

Figure 17:
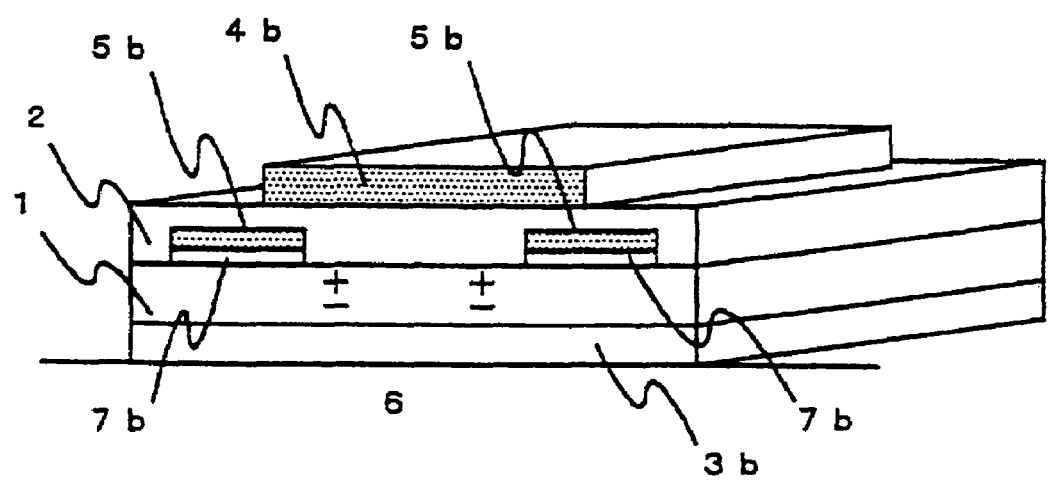
FIG. 17 is an isometric view showing a second modification of the third embodiment.

FIG. 17 shows a second modification of the illustrative embodiment. As shown, anode buffer layers 7b intervene between the light-emitting material layer 1 and the anodes 5b. The anode buffer layers 7b are formed of a material that transfers holes from the anodes 5b to the light-emitting material layer 1, but does not transfer electrons from the latter to the former. This prevents electrons not contributing to light emission from migrating from the light-emitting material layer 1 to the anodes 5b, thereby enhancing efficient light emission. However, this modification also needs an extra cost due to the extra step of forming the anode buffer layer 7a.

If desired, the cathode buffer layer 8b, FIG. 16, and anode buffer layers 7b, FIG. 17, may be combined, although not shown specifically.

Figure 18:
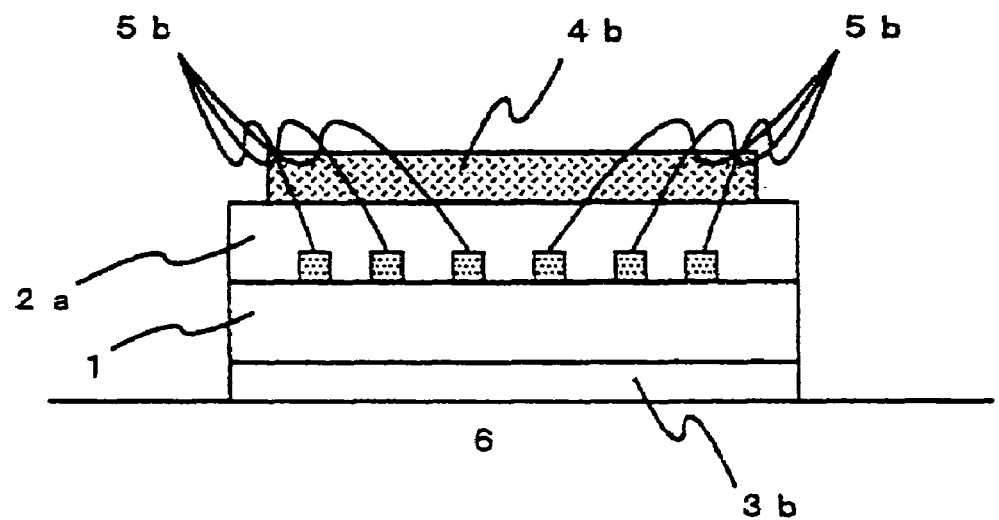
FIG. 18 is a section showing a third modification of the third embodiment.
Figure 19:
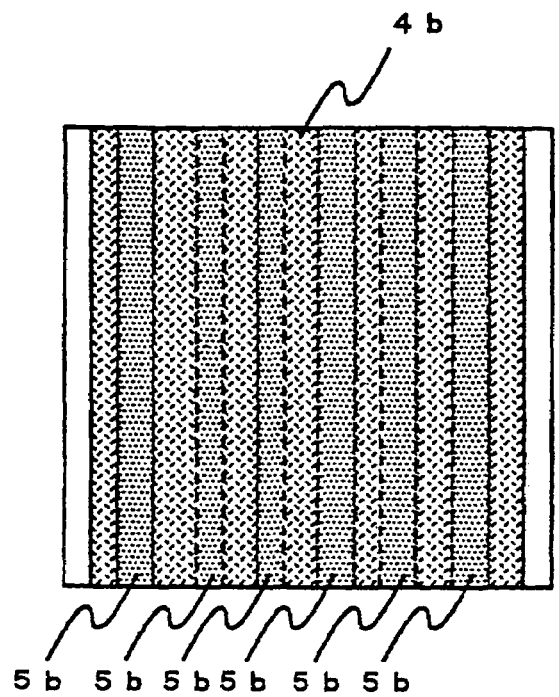
FIG. 19 is a plan view showing the third modification.
Figure 20:
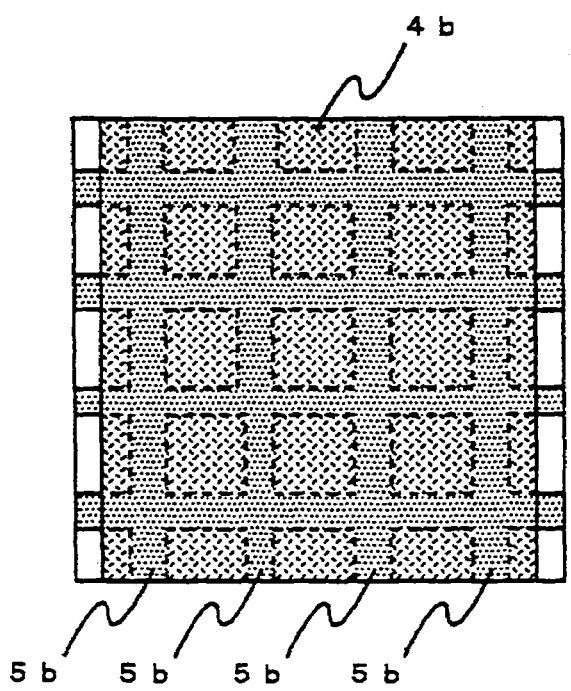
FIG. 20 is a plan view showing a mesh pattern applicable to a cathode included in the third modification.

FIGS. 18 and 19 show a third modification of the illustrative embodiment. As shown, the anodes 5b are implemented as a narrow, stripe pattern. FIG. 20 shows a mesh pattern that may be substituted for the stripe pattern.

Figure 21:
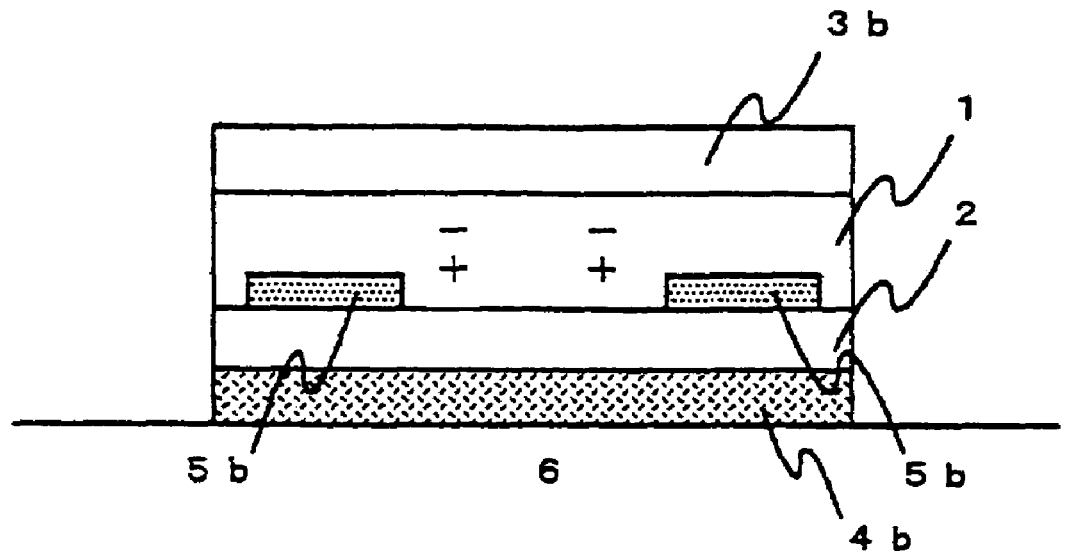
FIG. 21 is a section showing a fourth embodiment of the present invention.

Reference will be made to FIG. 21 for describing a fourth embodiment of the present invention. As shown, the auxiliary electrode 4b is formed on the substrate 6 while the insulation layer 2 is formed on the auxiliary electrode 4b. The anode pattern 5b, light-emitting material layer 1 and cathode 3b are sequentially stacked on the insulation layer 2 in this order. A voltage is applied between the cathode 3b and the anodes 5b. A voltage is also applied between the auxiliary electrode 4b and the anodes 5b in the same direction as the above voltage.

The illustrative embodiment achieves the same advantages as the third embodiment because of the assist voltage applied between the cathode 3b and the auxiliary electrode 4b. In addition, the cathode 3b is patterned before the step of forming the light-emitting material layer 1, so that the layer 1 is free from damage ascribable to the patterning of the cathode 3b.

Figure 22:
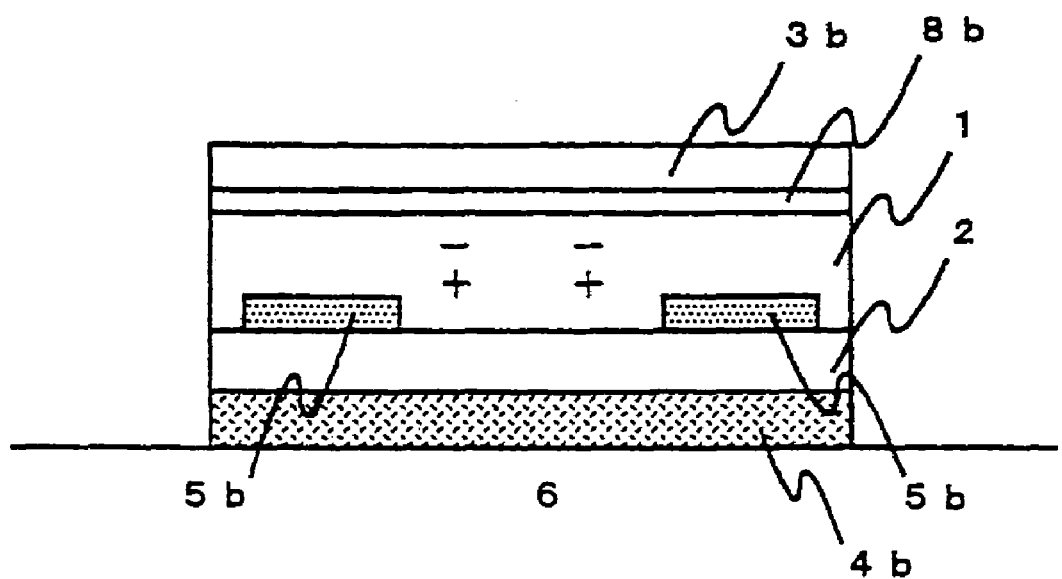
FIG. 22 is a section showing a first modification of the fourth embodiment.

FIG. 22 shows a first modification of the illustrative embodiment. As shown, the cathode buffer layer 8b intervenes between the light-emitting material layer 1 and the cathode 3b. The cathode buffer layer 8b is formed of a material that transfers electrons from the cathode 3b to the light-emitting material layer 1, but does not transfer holes from the latter to the former. This prevents holes not contributing to light emission from migrating from the light-emitting material layer 1 to the cathode 3b, thereby enhancing efficient light emission. The modification, however, increases costs due to the extra step of forming the anode buffer layer 7a.

Figure 23:
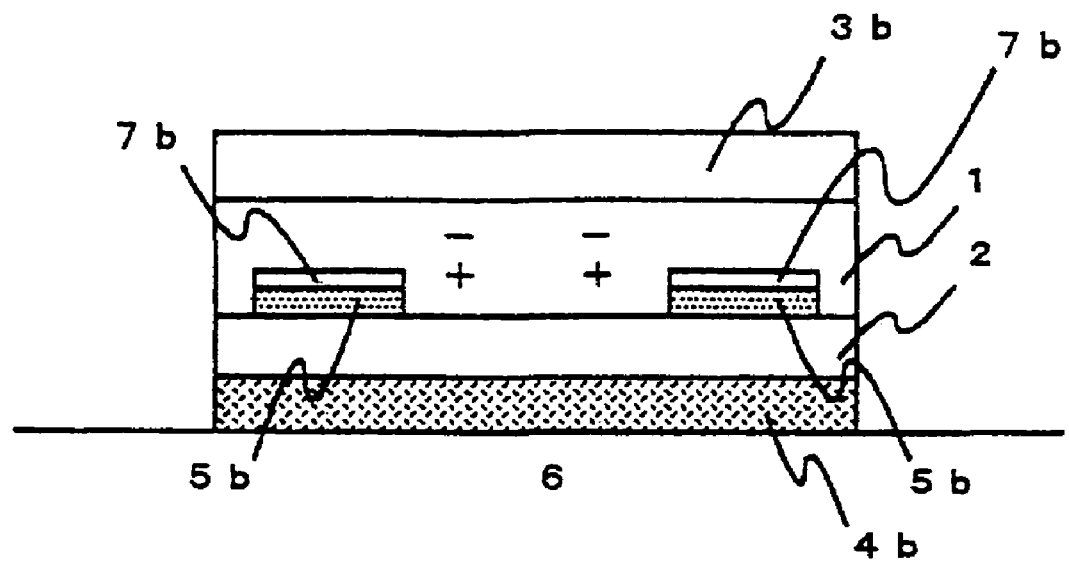
FIG. 23 is a section showing a second modification of the fourth embodiment.

FIG. 23 shows a second modification of the illustrative embodiment. As shown, the anode buffer layers 7b intervene between the light-emitting material layer 1 and the anodes 5b. The anode buffer layers 7b are formed of a material that transfers holes from the anodes 5b to the light-emitting material layer 1, but does not transfer electrons from the latter to the former. This prevents electrons not contributing to light emission from migrating from the light-emitting material layer 1 to the anodes 5b, thereby enhancing efficient light emission. However, this modification also increases due to the extra step of forming the anode buffer layer 7a.

If desired, the cathode buffer layer 8b, FIG. 22, and anode buffer layers 7b, FIG. 23, may be combined, although not shown specifically.

Figure 24:
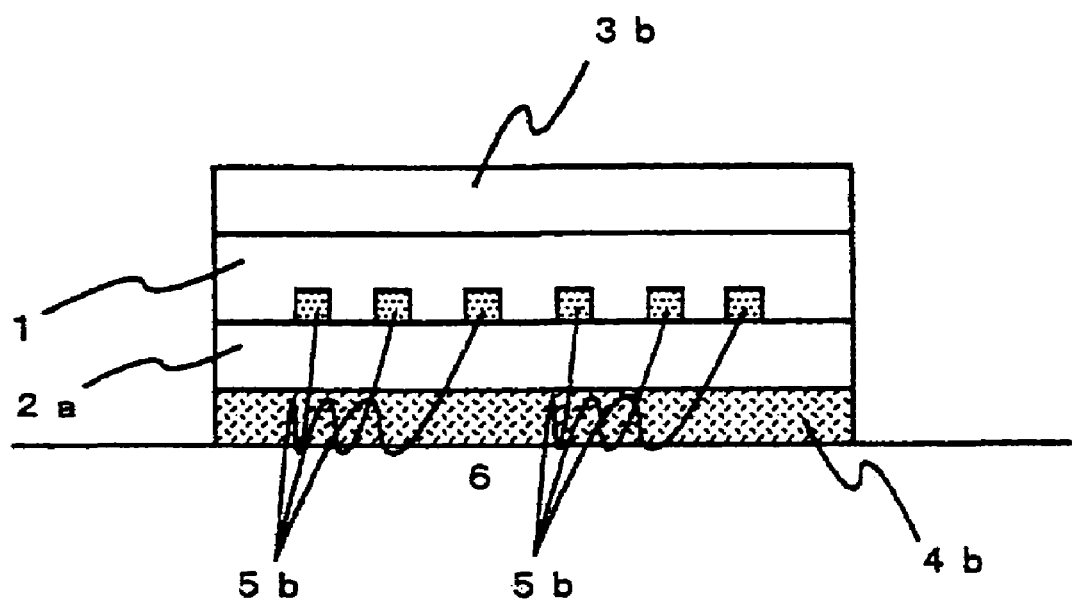
FIG. 24 is a section showing a third modification of the fourth embodiment.
Figure 25:
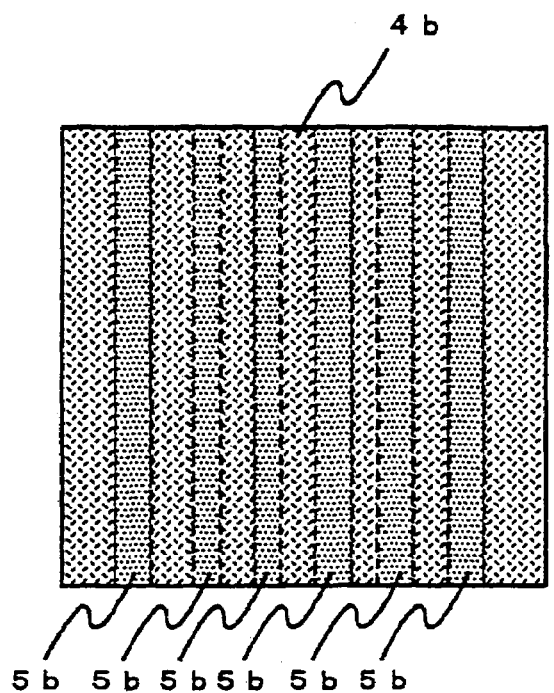
FIG. 25 is a plan view showing the third modification.
Figure 26:
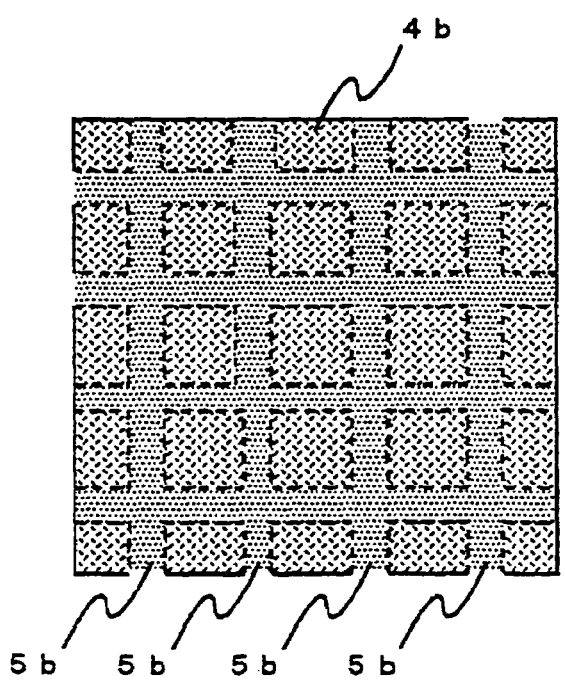
FIG. 26 is a section showing a mesh pattern applicable to a cathode included in the third modification.

FIGS. 24 and 25 show a third modification of the illustrative embodiment. As shown, the anodes 5b are implemented as a narrow, stripe pattern. FIG. 26 shows a mesh pattern that may be substituted for the stripe pattern.

Specific configurations of the light-emitting material layer 1 will be described with reference to FIGS. 27A through 27F. As shown, a cathode 10 and an anode 12 sandwich the light-emitting material layer 1 at the bottom and the top, respectively. While this structure directly applies to the third embodiment described with reference to FIGS. 15 through 20, it must be turned upside down in the case of the first embodiment described with reference to FIGS. 1 through 7.

Figure 27A:
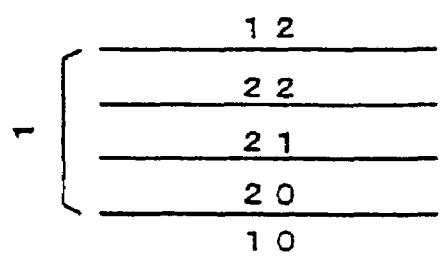
FIGS. 27A through 27F are views each showing a particular configurations of the a light-emitting material layer included in the light-emitting body of the present invention.

In the configuration shown in FIG. 27A, the light-emitting material layer 1 is made up of a hole injection/transport layer 20, an emission layer 21 and an electron injection/transport layer 22 sequentially stacked on the cathode 10 in this order.

Figure 27B:
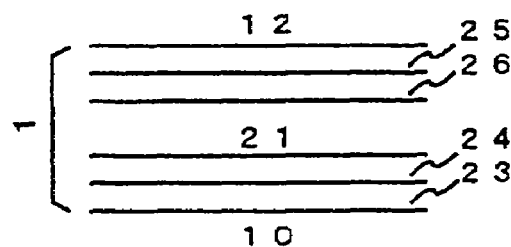

In the configuration shown in FIG. 27B, the light-emitting material layer is made up of a hole injection layer 23, a hole transport layer 24, an emission layer 21, an electron transport layer 26 and an electron injection layer 25 sequentially stacked on the cathode 10 in this order. If desired, the hole injection/transport layer 20 may be substituted for the stack of the hole injection layer 23 and hole transport layer 24. Likewise, the electron injection/transport layer 22 may be substituted for the electron transport layer 26 and electron injection layer 25.

Figure 27C:
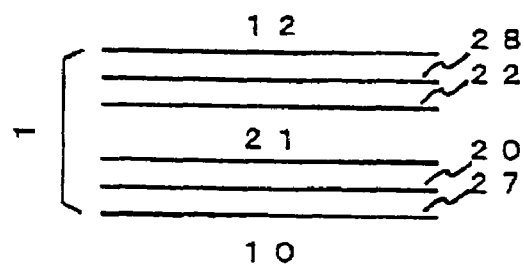

In the configuration shown in FIG. 27C, the light-emitting material layer 1 is made up of an anode buffer layer 27, the hole injection/transport layer 20, emission layer 21, electron injection/transport layer 22 and a cathode buffer layer 28 sequentially stacked on the cathode 10 in this order. Either one of the anode buffer layer 27 and cathode buffer layer 28 can be omitted, as the case may be.

Figure 27D:
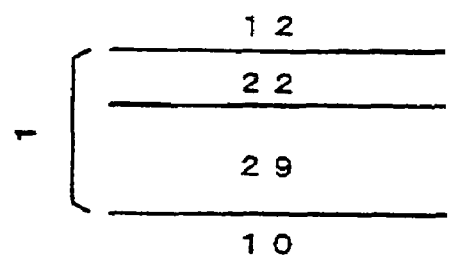

In the configuration shown in FIG. 27D, the light-emitting material layer 1 is made up of an emission layer 29 and the electron injection/transport layer 22 sequentially stacked on the cathode 10 in this order. The emission layer 29 plays the role of a hole injection/transport layer at the same time.

Figure 27E:
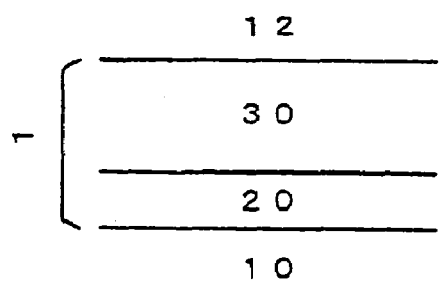
Figure 27F:
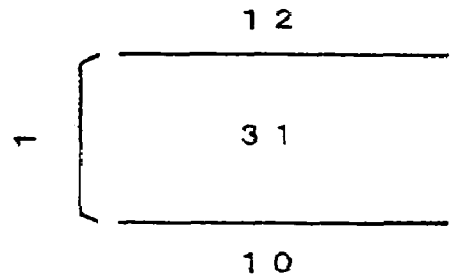

In the configuration shown in FIG. 27E, the light-emitting material layer 1 is made up of the hole injection/transport layer 20 and an emission layer 30, which plays the role of an electron injection/transport layer at the same time. Further, in the configuration shown in FIG. 27F, the light-emitting material layer 1 is implemented as an emission layer 31 serving as a hole injection/transport layer and an electron injection/transport layer at the same time.

Figure 28:
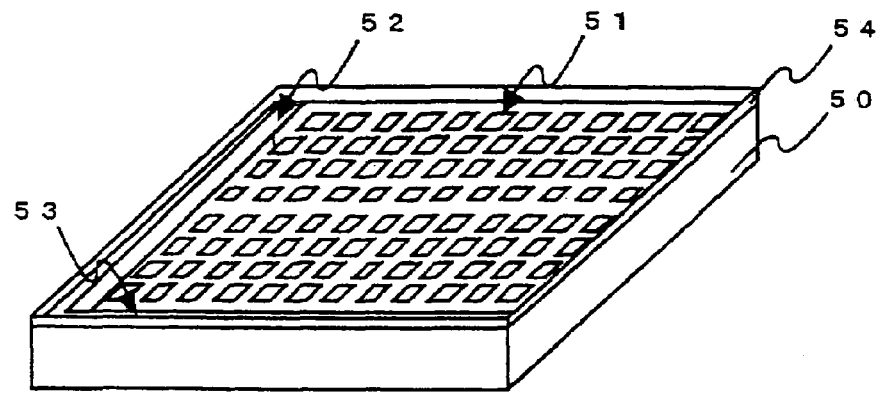
FIG. 28 is a view showing a light-emitting display in accordance with the present invention.

FIG. 28 shows the basic arrangement of a light-emitting display in accordance with the present invention. As shown, the display device includes a transparent substrate 50 on which a plurality of light-emitting devices 51 are regularly arranged. The display additionally includes a vertical drive circuit 52, a horizontal drive circuit 53 and a protection layer 54 for protecting them. The display device is produced by a unique procedure that will be described later specifically.

Figure 29:
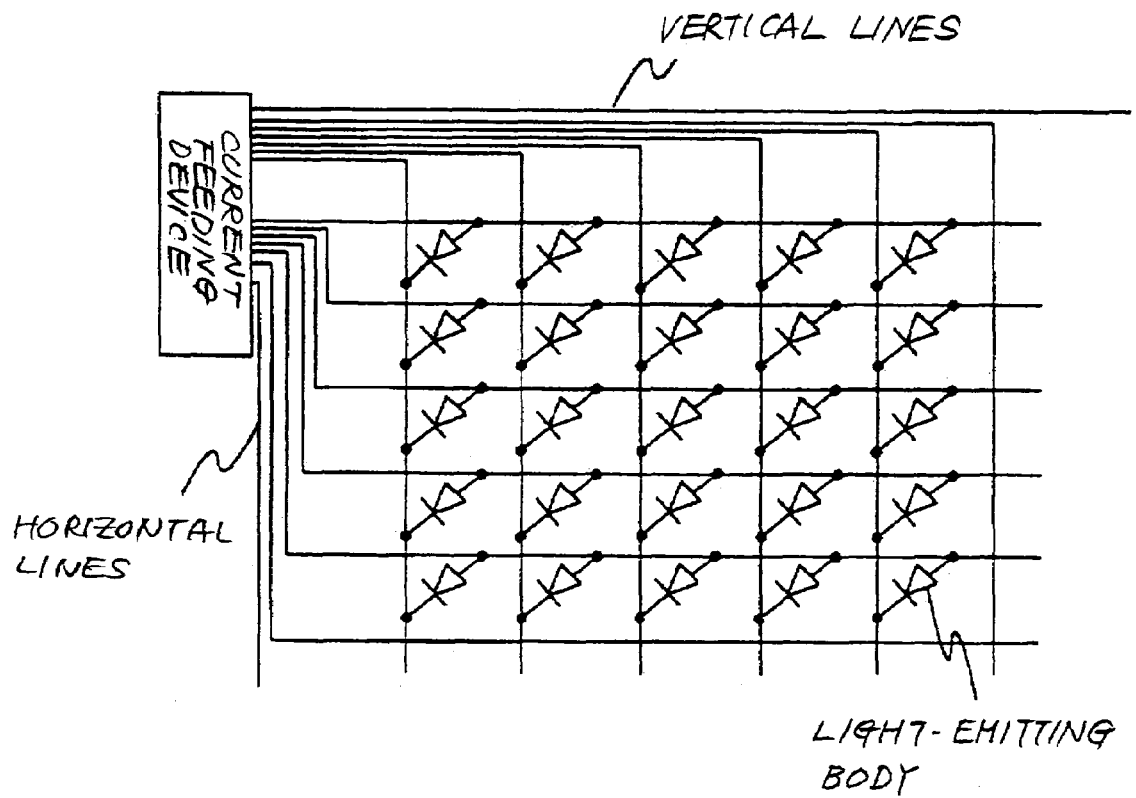
FIG. 29 is a view showing a first embodiment of the light-emitting display.

FIG. 29 shows a first embodiment of the light-emitting display in accordance with the present invention. As shown, a group of vertical lines and a group of horizontal lines are arranged in a matrix pattern and connected to a current feeding device, as illustrated. A light-emitting body is positioned at each point where one vertical line and one horizontal line intersect each other, and connected to such lines. The current feeding device is capable of feeding a current to any one of the light-emitting devices by selecting the vertical line and horizontal line connected to the light emitting device. It is impossible with this configuration to control the emission and non-emission of all of the light-emitting devices. However, by using an afterimage, it is possible to allow emission and non-emission to appear as if they were effected at the same time despite a time lag, only if the emitting points are switched at high speed.

Figure 30A:
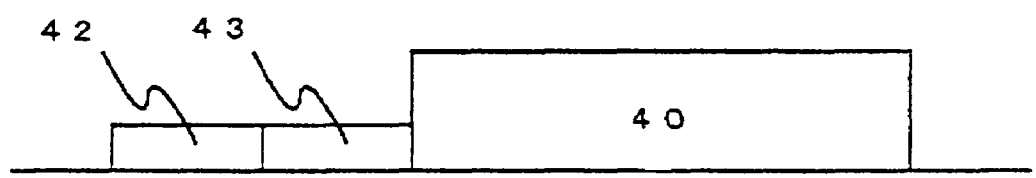
FIGS. 30A through 30B are views showing a second embodiment of the light-emitting display.
Figure 30B:
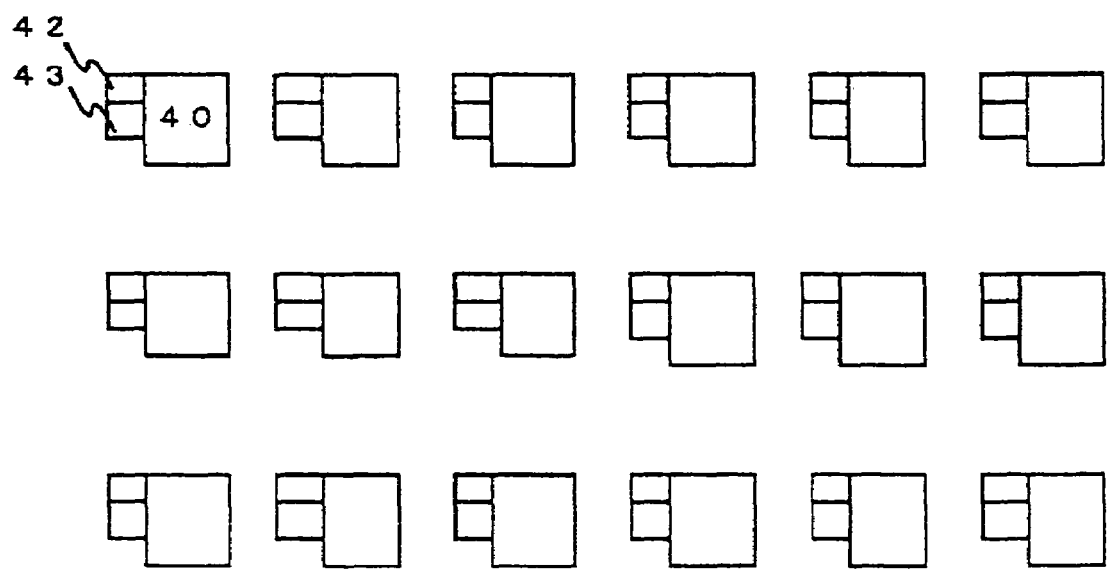

FIG. 30A shows a light-emitting device applicable to a second embodiment of the light-emitting display in accordance with the present invention. As shown, the light-emitting device includes a light-emitting body 40 connected to a current feeding device 43, which is connected to a switching device 42. In practice, as shown in FIG. 30B, a plurality of light-emitting devices each having the configuration shown in FIG. 30A are arranged in a matrix. While FIG. 30B shows a three-row six-column matrix, such a matrix is only illustrative.

Figure 31:
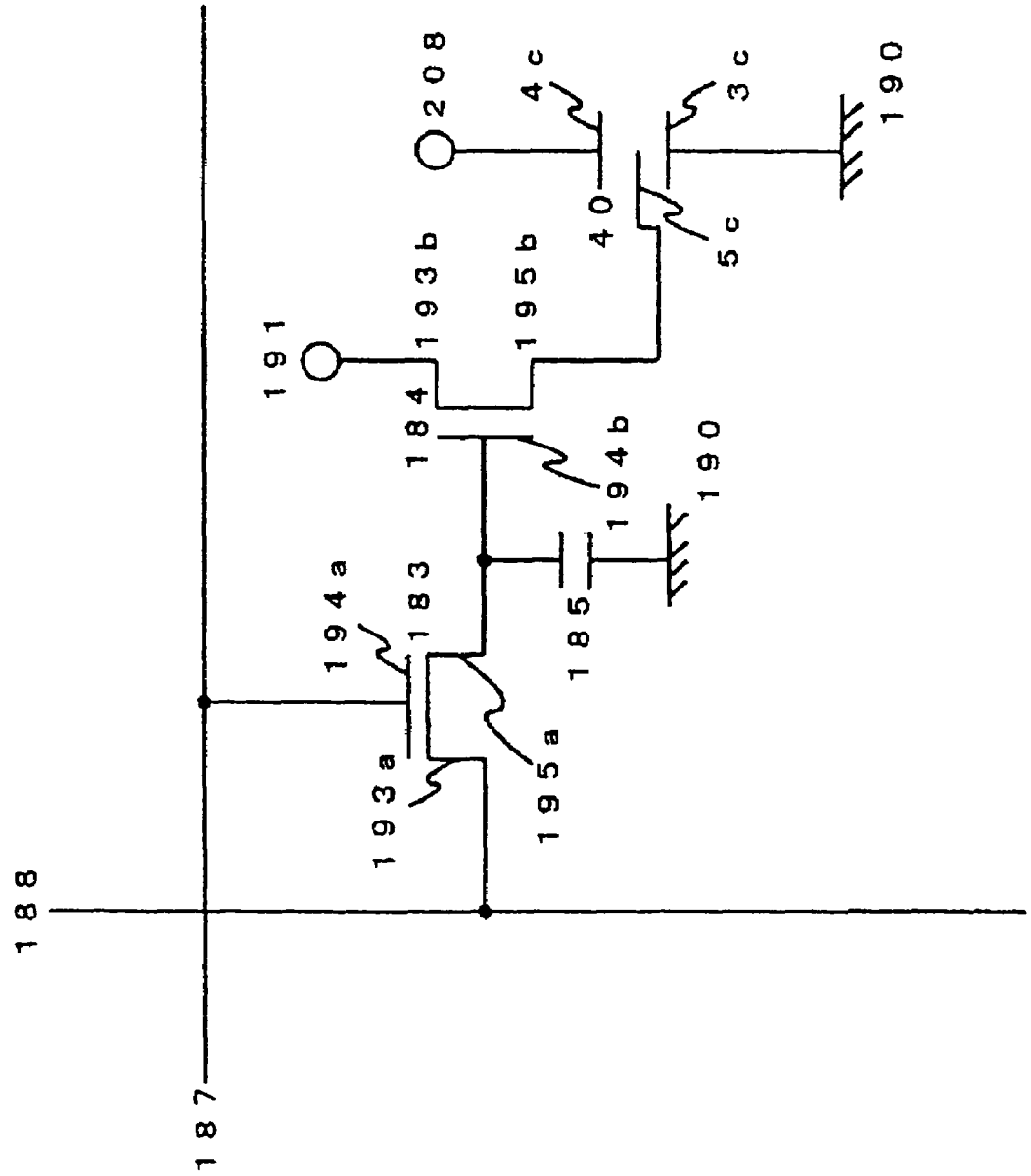
FIG. 31 is a view showing a circuit arrangement showing a specific configuration of a light-emitting device in accordance with the present invention.

FIG. 31 shows a specific circuit associated with the light-emitting body 40. The specific circuit uses a switching transistor and a current feeding transistor as a switching devices and a current feeding device, respectively. As shown, a first and a second switching line 187 and 188, respectively, intersect each other, as illustrated. A first switching transistor 183 has a source 193a and a gate 194a connected to the second switching line 188 and first switching line 187, respectively. The drain 195a of the first switching transistor 183 is connected to the gate 194b of a second switching transistor 184 and one terminal of a capacitor 185.

The other terminal of the capacitor 185 is connected to ground 190. The source 193b and drain 195b of the second switching transistor 184 are respectively connected to a power supply 1.91 and an anode 5c included in the light-emitting body 40. A cathode 3c and an auxiliary electrode 4c also included in the light emitting device 40 are connected to ground 190 and a power supply 208, respectively.

In operation, when a voltage is applied to the gate 194a of the first switching transistor 183 via the first switching line 187, conduction is set up between the source 193a and the drain 195a. In this condition, when a voltage is applied to the drain 195a via the second switching line 188, the capacitor 185 is charged. Therefore, even when the voltage on the first switching line 187 or the second switching line 188 is shut off, the voltage is continuously applied to the gate 194b of the second switching transistor 184 until the capacitor 185 has been fully discharged. The voltage applied to the gate 194b of the transistor 184 sets up conduction between the source 193b and the drain 195b. As a result, a current output from the current source 191 flows to ground 190 via the light-emitting body 40, causing the body 40 to emit light.

Figure 32:
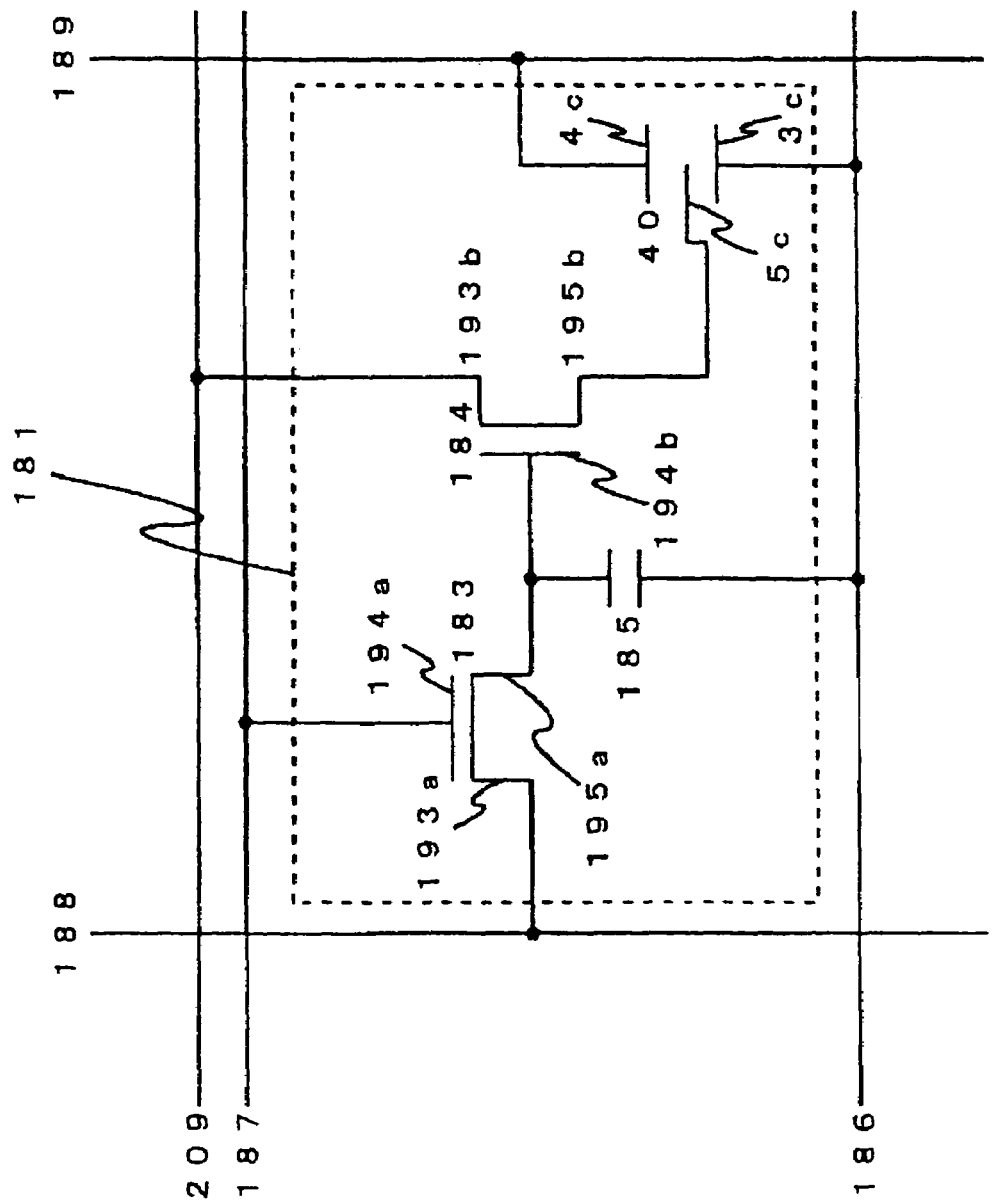
FIG. 32 is a view showing another specific configuration of the light-emitting device.

FIG. 32 is identical with FIG. 31 except for the addition of a ground line 186, a current supply line 209, and a constant voltage line 189. A block indicated by a dotted line in FIG. 32 shows a unit device 181.

Figure 33:
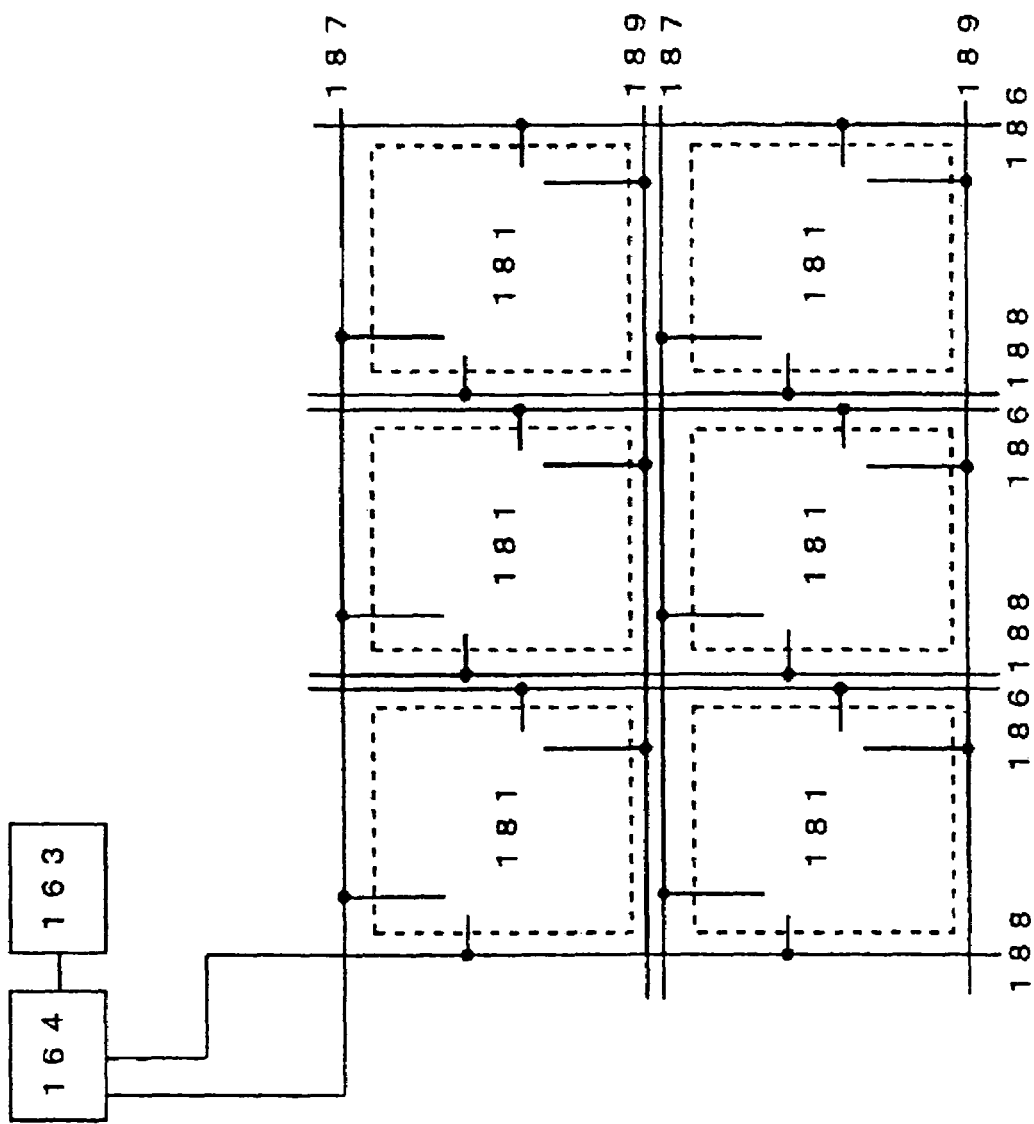
FIG. 33 is a view showing a typical arrangement of the light-emitting device.

FIG. 33 shows a typical, light-emitting display capable of accommodating the light-emitting bodies and light-emitting devices of the present invention. As shown, the display includes a plurality of unit devices (pixels hereinafter) 181 that may have the configuration shown in FIG. 31 each. Each pixel 181 is connected to a particular first switching line 187 and a particular second switching line 188. The first and second switching lines 187 and 188 are connected to a voltage control circuit 164, which is connected to a video signal source 163.

An apparatus for reproducing video data out of a video medium or for converting electromagnetic input data to an electric signal is built in or connected to the video signal source 163. The video signal source 163 transforms an electric signal output from such an apparatus to an electric signal having a format that the voltage control circuit 164 can receive, and delivers the electric signal to the voltage control circuit 164. The voltage control circuit 164 further transforms the input electric signal and determines the pixels 181 to emit light and the duration of emission, thereby determining voltages to be applied to the two switching lines 187 and 188 as well as the duration and timing of the application. This allows the display to display a desired image in accordance with the video data.

The display can be implemented as a color display if it is configured such that the individual pixel emits light of a color based on R (red), G (green) or B (blue).

Typical materials applicable to the various layers constituting the light-emitting device will be described hereinafter. The cathode, anode and auxiliary electrode should preferably be formed of, but not limited to, Ti, Al, AlLi, Cu, Ni, Ag, AgMg, Au, Pt, Pd, Ir, Cr, Mo, W or an alloy thereof. Alternatively, use may be made of polyaniline, PEDOT or similar conductive polymer. Further, use may be made of a transparent film whose major component is an oxide, e.g., ITO, indium zinc oxide (IZO), indium oxide ($In_2O_3$), tin oxide ($SnO_2$) or zinc oxide (ZnO). Such an oxide may be slightly deviated from its stoichiometric composition. ITO, for example, usually contains $In_2O_3$ and $SnO_2$ in a stoichiometric composition, but the amount of oxygen may be slightly different therefrom. The ratio of $SnO_2$ to $In_2O_3$ should preferably be 1 wt % to 20 wt %, more preferably 5 wt % to 32 wt %. The ratio of $ZnO_2$ to $In_2O_3$ should preferably be 12 wt % to 32 wt %.

The cathode should preferably be 50 nm to 500 nm thick, particularly 50 nm to 300 nm thick, and should preferably have resistivity between $1\times10^{-3}$ $\Omega\cdot cm$ and $1\times10^{-6}$ $\Omega\cdot cm$.

The cathode, anode and auxiliary electrode should preferably be formed by vapor deposition or sputtering (RF sputtering, DC sputtering or magnetron DC sputtering). Power for DC sputtering should preferably be between 0.1 W/cm$^2$ and 10 W/cm$^2$, particularly between 0.5 W/cm$^2$ and 7 W/cm$^2$. A preferable filming rate is between 0.1 nm/min and 100 nm/min, particularly between 1 nm/min and 30 nm/min.

As for magnetic field strength, flux density B on a target should preferably be between 500 Gauss and 2,000 Gauss, particularly between 800 Gauss and 1,500 Gauss, and should preferably be as great as possible. When an electrode is configured to confine electrodes around a target, the great flux density and therefore intense field strength increases the number of ions included in the sputter gas of plasma and hitting against the cathode target, thereby increasing plasma density. Dense plasma, in turn, increases the frequency of collision among the particles of plasma and causes kinetic energy to be partly lost. Consequently, sputtered particles slowly deposit on the substrate. While a method of forming a magnetic field on a target is open to choice, it is preferable to position a magnet on the rear side of a target, particularly inside a cooling portion. The magnet may be formed of Fe—Nd—B, Sm—Co, ferrite or alnico by way of example. Among them, Fe—Nd—B and Sm—Co are desirable because of high flux density available therewith.

As for a bias voltage, a voltage between the target and the substrate (bias electrode) should preferably be between 100 V and 300 V, particularly 150 V and 250 V. An excessively high bias voltage would increase the acceleration of particles and easily damage an electrode layer. An excessively low bias voltage would obstruct plasma discharge or lower plasma density, impairing the above effect.

The field strength and bias voltage both should preferably be adequately selected in matching relation to the environment of use, apparatus scale and so forth.

The sputter gas may be an inactive gas customary with a sputtering apparatus and may additionally contain $N_2$, $H_2$, $O_2$, $C_2H_4$, $NH_3$ or similar reactive gas in the case of reactive sputtering. Use should preferably be made of a mixture gas containing at least one of Ar, Kr and Xe, which are inactive and have relatively great atomic weights. Particularly, simple Ar, Kr or Xe is desirable.

When Ar, Kr or Xe gas is used, sputtered atoms repeatedly hit against the gas before reaching the substrate and then arrive at the substrate with reduced kinetic energy. This successfully reduces physical damage to an organic EL structure ascribable to the kinetic energy of sputtered atoms. Use may be made of a mixture gas containing at least one of Ar, Kr and Xe, in which case the total partial pressure of Ar, Kr and Xe that is 50% or above will be selected. The mixture of at least one of Ar, Kr and Xe and any desired gas allows reactive sputtering to be effected while maintaining the advantages of the present invention. Usually, the pressure of the sputter gas may be between 0.1 Pa and 20 Pa.

At least one of the anode and cathode should preferably be formed of a material and provided with thickness that transmit light by 80% or above.

Hereinafter will be described the organic layers included in the organic EL structure of the present invention. The emission layer injects and transports, holes and electrons and generates exciters based on the recombination of holes and electrons. For the emission layer, a compound that is electronically relatively neutral should preferably be used.

The hole injection/transport layer facilitates the injection of holes from the anode and stably transports holes while blocking electrons. The electron injection/transport layer facilitates the injection of electrons from the cathode and stably transports electrons while blocking holes. These layers cooperate to optimize the recombination region for thereby increasing emission efficiency.

The thickness of the emission layer, that of the hole injection/transport layer and that of electron injection/transport layer are open to choice and depend on the forming process selected. Preferably, such layers should be 10 nm thick to 300 nm thick each.

The thickness of the hole injection/transport layer and that of the electron injection/transport layer should preferably be equal to or about one-tenth to ten times as great as the thickness of the emission layer although they depend on the design of the recombination/emission region. When the two injection/transport layers each are implemented as an injection layer and a transport layer independent of each other, the injection layer and transport layer should preferably be 1 nm thick or above each. Usually, the upper limit of thickness is about 500 nm for both of the injection layer and transport layer. This is also true when two injection/transport layers are formed.

The emission layer of the present invention contains a fluorescent material, which is a compound having a light emitting function. The fluorescent material may be, e.g., at least one of compounds disclosed in Japanese Patent Laid-Open Publication No. 63-264692 mentioned earlier, e.g., quinacridone, rubrene or styryl pigment. Alternatively, use may be made of metal complex pigment or similar quinoline derivative containing tris(8-quinonolate)aluminum or similar 8-quinolinol or a derivative thereof as a ligand or a derivative of tetraphenylbutadien, anthracene, perylene, coronene or 12-phthaloperilene. Further, use may be made of a phenylanthracene derivative taught in Japanese Patent Application No. 6-110569 or tetraarylethene taught in Japanese Patent Application No. 6-114456.

The above compound should preferably be combined with a host substance capable of emitting light itself as a dopant. In such a case, the compound content of the emission layer should preferably be between 0.01 wt % and 10 wt %, more preferably between 0.1 wt % and 5 wt %. The compound allows the wavelength characteristic of the host substance to be varied to thereby implement emission in a long wavelength range and improve the emission efficiency and stability of the device.

The host substance should preferably be implemented by a quinolinolate complex, more preferably an aluminum complex containing 8-quinolinol or its derivative as a ligand. Japanese Patent Laid-Open Publication Nos. 63-264692, 3-255190, 5-70733, 5-258859 and 6-215874 disclose examples of an aluminum complex. More specifically, use may be made of tris(8-quinolinolate)aluminum, bis(8-quinolinolate)magnesium, bis(benzo{f}-8-quinolinolate)zinc, bis(2-methyl-8-quinolinolate)aluminum oxide, tris(8-quinolinolate)indium, tris(5-methyl-quinolinolate)aluminum, 8-quinolinolate lithium, tris(5-chloro-8-quinolinolate)gallium, bis(5-chloro-8-quinolinolate)calcium, 5,7-dichloro-8-quinolinolate aluminum, tris(5,7-dibromo-8-hydroxyquinolinolate)aluminum or poly[zinc(II)-bis(8-hydroxy-5-quinolinil)methane.

If desired, the aluminum complex may additionally contain a ligand other than 8-quinolinol or its derivative. The additional ligand may be any one of bis(2-methyl-8-quinolinolate)(phenolate)aluminum(III), bis(2-methyl-8-quinolate)(ortho-cresolate)aluminum(III), bis(2-methyl-8-quinolinolate) (metha-crezolate)aluminum(III), bis(2-methyl-8-quinolinolate)(para-crezolate)aluminum(III), bis(2-methyl-8-quinolinolate)(ortho-phenylphenolate)aluminum(III), bis(2-methyl-8-quinolinolate)(metha-phenylphenolate)aluminum(III), bis(2-methyl-8-quinolinolate)(para-phenylphenolate) aluminum (III), bis(2-methyl-8-quinolinolate)aluminum(III), bis(2-methyl-8-quinolinolate)(2,3-dimethylphenolate)aluminum(III), bis(2-methyl-8-quinolinolate) (2,6-dimethylphenolate)aluminum (III), bis(2-methyl-8-quinolinolate)(3,4-dimehtylphenolate)aluminum(III), bis(2-methyl-8-quinolinolate)(3,5-dimethylphynolate)aluminum(III), bis(2-methyl-8-quinolinolate)(3,5-di-tert-buthylphenolate)aluminum(III), bis(2-methyl-8-quinolinolate)(2,6-diphenylphenolate)aluminum(III), bis(2-methyl-8-quinolinolate)(2,4,6-triphenylphenolate)aluminum(III), bis(2-methyl-8-quinolinolate)(2,3,6-trimethylphenolate)aluminum(III), bis(2-methyl-8-quinolate)(2,3,5,6-tetramethylphenolate)aluminum(III), bis(2-methyl-8-quinolinolate)(1-naphthalate)aluminum(III), bis(2-methyl-quinolinolate)(2-naphthalate)aluminum(III), bis(2,4-dimethyl-8-quinolinolate)(ortho-phenylphenolate)aluminum(III), bis(2,4-dimethyl-8-quinolinolate)(para-phenylphenolate)aluminum(III), bis(2,4-dimethyl-8-quinolinolate)(metha-phenylphenolate)aluminum(III), bis(2,4-dimethyl-8-quinolinolate)(3,5-dimethylphenolate)aluminum(III), bis(2,4-dimethyl-8-quinolinolate) (3,5-di-tert-buthylphenolate)aluminum(III), bis(2-methyl-4-ethyl-8-quinolinolate)(para-cresolate)aluminum(III), bis(2-methyl-4-methoxy-8-quinolinolate) (para-phenylphenolate)aluminum(III), bis(2-methyl-5-cyano-8-quinolinolate)(ortho-cresolate)aluminum(III), and bis(2-methyl-6-trifluoromethyl-8-quinolinolate)(2-naphthalate)aluminum (III).

Other ligands applicable to the present invention include bis(2-methyl-8-quinolinolate)aluminum(III)-μ-oxo-bis(2-methyl-8-quinolinolate)aluminum(III), bis(2,4-dimethyl-8-quinolinolate)aluminum(III)-μ-oxo-bis(2,4-dimethyl-8-quinolinolate)aluminum(III), bis(4-ethyl-2-methyl-8-quinolinolate)aluminum(III)-β-oxo-bis(4-ethyl-2-methyl-8-quinolinolate)aluminum(III), bis(2-methyl-4-methoxyquinolinolate)aluminum(III)-μ-oxo-bis(2-methyl-4-methoxyquinolinolate)aluminum(III), bis(5-cyano-2-methyl-8-quinolinolate)aluminum(III)-μ-oxo-bis(5-cyano-2-methyl-8-quinolinolate)aluminum(III), and bis(2-methyl-5-trifluoromethyl-8-quinolinolate)aluminum(III)-μ-oxo-bis(2-methyl-5-trifluoromethyl-8-quinolinolate)aluminum(III).

Other preferable host substances include a phenylanthracene derivative taught in Laid-Open Publication No. 6-110569 and a tetraarylethene derivative.

The emission layer may play the role of an electron injection/transport layer at the same time, in which case use should preferably be made of tris(8-quinolinolate)aluminum by way of example. Such a fluorescent substance should only be deposited by vacuum evaporation.

Further, the emission layer should preferably be implemented as a mixture of at least one compound capable of implanting and transporting holes and at least one compound capable of implanting and transporting electrons. Such a mixture layer should preferably contain the dopant. The compound content of the mixture layer should preferably be between 0.01 wt % and 20 wt %, more preferably between 0.1 wt % and 15 wt %.

In the mixture layer, paths for the hopping conduction of carriers are formed, so that each carrier migrates through a substance superior in polarity. That is, the injection of a carrier of opposite polarity occurs little. This protects the organic compounds from damage and thereby extends the life of the device. Further, if the mixture layer contains the previously stated dopant, then it is possible to vary the emission wavelength characteristic of the mixture layer itself, i.e., to shift the emission wavelength to a long wavelength range. In addition, it is possible to increase light intensity and to improve the stability of the device.

The hole injection/transport compound and electron injection/transport compound of the mixture layer are selected from compounds to be described specifically later. As for the hole injection/transport compound, it is preferable to use an amine derivative that is highly fluorescent, e.g., a triphenyldiamine derivative, a stylamine derivative or an amine derivative having an aromatic condensed ring.

As for the electron injection/transport compound, it is preferable to use a metal complex containing a quinoline derivative, 8-quinolinol or its derivative as a ligand, particularly tris(8-quinolinolate)aluminum(Alq3). The phenyanthracene derivative or tetraanylethene derivative mentioned previously is also desirable.

Assuming that the hole injection/transport compound is implemented by any one of the substances stated above, the mixture ratio is selected by taking account of carrier mobility and carrier concentration. Generally, the ratio in weight of the hole injection/transport compound to the electron injection/transport compound should preferably be between 1/99 and 99/1 or more preferably between 10/90 and 90/10, particularly between 20/80 and 80/20.

The mixture layer has thickness corresponding to a single molecule layer. Therefore, the thickness should preferably be between 1 nm and 85 nm or more preferably between 5 nm and 60 nm, particularly between 5 nm and 50 nm.

The mixture layer should preferably be formed by evaporation using different evaporation sources. Alternatively, if the vapor pressures (evaporation temperatures) are equal or extremely close to each other, then the evaporation sources may be mixed in a single evaporation board beforehand. While the compounds of the mixture layer should preferably be uniformly mixed together, they may be distributed in the form of lands, if necessary. Generally, to form the emission layer with preselected thickness, it is a common practice to deposit an organic fluorescent substance by evaporation or to disperse it in a resin binder and then coat the resulting dispersion.

As for the hole injection/transport layer, use may be made of any one of various organic compounds taught in, e.g., Japanese Patent Laid-Open Publication Nos. 63-295695, 2-191694, 3-792, 5-234681, 5-239455, 0.5-299174, 7-126225, 7-126226 and 8-100172 as well as in EP 0660955A1 mentioned earlier. The organic compounds include tetraarylbenzicine(triaryldiamine or triphenyldiamine (TPD)), aromatic ternary amine, hydrozone derivatives, triazole derivatives, imidazole derivatives, oxydiazole, derivatives containing amino radicals, and polythiophene. Two or more of such compounds may be combined in a single layer or independent layers.

When the hole injection/transport layer are divided into a hole injection layer and a hole transport layer, any suitable combination of the compounds available for the injection/transport layer may be selected. At this instant, The compound with smaller ionization potential should preferably be positioned closer to the anode (e.g. ITO) than the compound with greater ionization potential. The surface of the anode should preferably be implemented by a compound capable of forming a desirable thin film. This is also true when two or more hole injection/transport layers are formed.

The above stacking order prevents the drive voltage from dropping and bringing about current leak and the appearance and growth of dark spots. Further, evaporation used to produce the device makes even a film as thin as about 1 nm to 10 nm uniform and free from pinholes. Therefore, even when the hole injection layer is implemented by a compound having small ionization potential and exhibiting absorption in a visible range, there can be obviated the fall of efficiency ascribable to the variation of the tone of color or reabsorption. The hole injection/transport layer, like the emission layer, may be formed by evaporation.

As for the electron injection/transport layer, which may or may not be included, use may be made of an organic metal complex or similar quinoline derivative containing tris(8-quinolilate)aluminum(Alq3) or similar 8-quinolinole or its derivative as a ligand, an oxadiazole derivative, a perylene derivative, a pyridine derivative, a pyrimidine derivative, a quinoxyaline derivative, a diphenylquinone derivative or a nitrated fluorene derivative by way of example. When the electron injection/transport layer plays the role of the emission layer at the same time, use should preferably be made of, e.g., tris(8-quinolilate)aluminum. The electron injection/transport layer, like the emission layer, may be formed by evaporation.

When the electron injection/transport layer are divided into an electron injection layer and an electron transport layer, any suitable combination of the compounds available for the injection/transport layer may be selected. At this instant, The compound with greater electron affinity should preferably be positioned closer to the cathode than the compound with smaller electron affinity. This is also true when two or more electron injection/transport layers are formed.

The material of the substrate is open to choice and may be suitably selected in conformity to the substances constituting the stack of conductive layers. For example, use may be made of aluminum or similar metal, glass, quartz, resin or similar transparent or semitransparent material. Use may even be made of an opaque material, e.g., alumina or similar ceramics, a stainless steel sheet or similar metal sheet whose surface is oxidized or otherwise insulated, phenol resin or similar thermosetting resin or polycarbonate-or similar thermoplastic resin.

While the organic EL light-emitting body of the present invention is usually implemented as a DC drive type of EL device, it may alternatively be driven by AC or pulses. A voltage to be applied to the light-emitting body is usually between 5 V and 20 V.

As for the anode buffer layer, in a low molecule series, use is often made of high-molecule arylamine generally referred to as star burst, typically copper phthalocyanine (CuPc) or m-MTDATA. Alternatively, use may be made of a layer with high conductivity produced by causing Lewis acid to act on a triphenylamine derivative to form radial cations. Further, in a high-molecule series, polyanyline (PAni), polythiophene (PEDOT) or similar conductive polymer may be used. The anode buffer layer, like the emission layer, may be formed by evaporation.

The insulation layer may be implemented by Al oxide, Al nitride, Si oxide, Si nitride or a mixture thereof or even by a nonconductive polymer or resin. In the case of an oxide, a nitride or a mixture thereof, a target formed of such a substance is sputtered by use of Ar, Kr or Xe gas or a mixture gas containing at least one of Ar, Kr and Xe. The sputtering is implemented by RF sputtering or DC sputtering, preferably by RF magnetron sputtering or DC magnetron sputtering. Alternatively, reactive sputtering may be executed with a metal target by using Ar, Kr or Xe gas or a mixture gas containing at least one of Ar, Kr and Xe with oxygen, nitrogen or a mixture thereof added thereto.

Assume that a nonconductive polymer or resin is applied to the insulation layer. Then, the insulation layer is formed by the steps of dissolving the polymer or resin in a solvent or liquefying it with heat, coating the resulting liquid by, e.g., spin coating, forming a photoresist pattern on the coating, and then milling or otherwise patterning the polymer or resin. Alternatively, an anode material may be deposited on the polymer or resin via a mask, which includes a transmitting portion and a non-transmitting portion, by evaporation, sputtering or CVD (Chemical Vapor Deposition) (mask evaporation process). Another alternative procedure is liquefying a light-emitting material by dissolving it in a solvent or heating it, jetting a small amount of the resulting solution onto the substrate, and vaporizing or cooling the solvent to thereby solidify it (ink jet process).

The switching devices or the current feeding devices are implemented by transistors or devices based on transistors. The first switching lines, current feeding lines, second switching lines, common lines and ground lines are formed of, e.g., Al, Cu, Ta, Ru or WSi by sputtering, evaporation or CVD. For the source electrodes, drain electrodes and gate electrodes of the switching transistors and current feeding transistors, too, use may be made of Al, Cu, Ta, Ru or WSi and sputtering, evaporation or CVD. The gate insulation film, first and second interlayer insulation films and barrier layer may be formed of Al oxide, Al nitride, Si oxide, Si nitride or a mixture thereof.

Figure 34A:
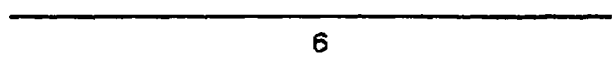
FIG. 34 is a view showing a specific procedure for producing the light-emitting device of the present invention.
Figure 34B:
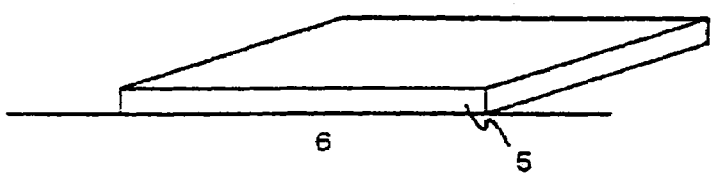

Reference will be made to FIGS. 34A through 34F for describing a typical procedure for producing the light-emitting device having the configuration shown in FIG. 1. First, as shown in FIG. 34A, the substrate 6, which is typically formed of alkali-free glass, is prepared. As shown in FIG. 34B, the anode pattern 5 is formed on the substrate 6. To form the anode pattern 5, the following specific method may be used. After a film has been formed by, e.g., sputtering, evaporation or CVD, a photoresist is coated by spin coating. Subsequently, the photoresist is patterned via an optical mask by exposure and development, and then gate film portions where the photoresist pattern is absent are removed by milling. Finally, the photoresist is removed by, e.g., being dissolved in a solvent. Another specific method is positioning a mask with a transmitting portion and a non-transmitting portion on the substrate and then causing the anode material to form a film by evaporation, sputtering or CVD (mask deposition process). The alternative method forms the anode pattern at a time.

Figure 34C:
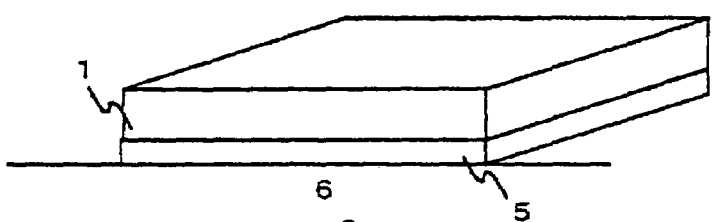

As shown in FIG. 34C, the light-emitting material layer 1 is patterned over the anode pattern 5. In FIG. 34C, the layer 1 is shown as being identical in size with the anode layer 5. However, the layer 1 may be partly or entirely sized greater than or smaller than the anode pattern 5. A specific method of forming the layer 1 is the mask evaporation process or steps of liquefying a light-emitting material by dissolving it in a solvent or heating it, jetting a small amount of the resulting liquid onto the substrate, and then solidifying the solvent by evaporation or cooling (ink jet process).

Figure 34D:
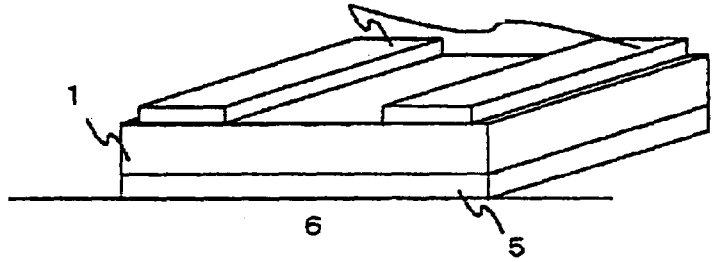

As shown in FIG. 34D, the cathodes 3 are patterned on the light-emitting material layer 1 in the same manner as the anode pattern 5.

Figure 34E:
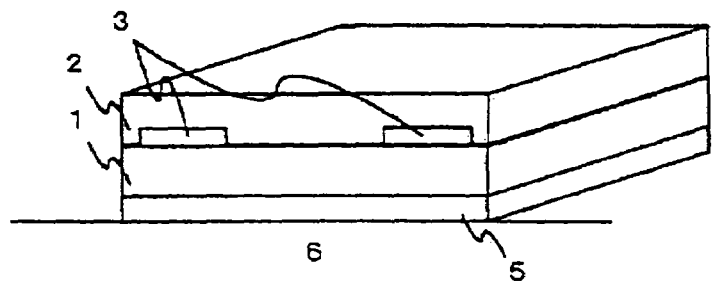

As shown in FIG. 34E, the insulation layer 2 is patterned on the light-emitting material layer 1 and cathodes 3. In FIG. 34e, the insulation layer 2 is shown as being identical in size with the underlying layers. However, the insulation layer 2 may be partly or entirely sized greater than or smaller than the underlying layers. A specific method of forming the insulation layer 2 is the mask evaporation process or steps of liquefying a light-emitting material by dissolving it in a solvent or heating it, jetting a small amount of the resulting liquid onto the substrate, and then solidifying the solving by evaporation or cooling (ink jet process).

Figure 34F:
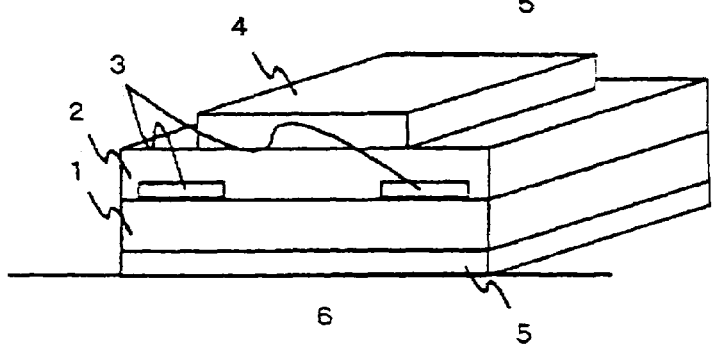

Finally, as shown in FIG. 34F, the auxiliary electrode 4 is patterned on the insulation layer 2. While the auxiliary electrode 4 is shown as being smaller in size than the underlying layers, it may be sized equal to or greater than the underlying layers. The auxiliary electrode 4 may be formed by the same method as applied to the anode 5.

Specific examples of the present invention will be described hereinafter.

EXAMPLE 1

In Example 1, the cathode pattern had a greater work function than the portion of the light-emitting layer contacting the cathode. More specifically, the light-emitting body shown in FIGS. 8 and 9 was produced by use of specific substances listed in FIG. 35. Assume that the anode, light-emitting material layer and cathodes are sequentially stacked on the substrate in this order. Then, ITO forming the anode has a greater work function than a benzoquinolyl beryllium complex forming the light-emitting material layer, so that holes are injected from the anode into the light-emitting material layer. However, Au forming the cathodes has a sufficiently greater work function than the benzoquinolyl beryllium complex. Therefore, electrons were not injected from Au into the benzoquinolyl beryllium complex even when a low voltage, e.g., 5 V was applied between the anode and the cathodes. This obviated the recombination of electrons and holes in the benzoquinolyl beryllium complex and therefore light emission.

For comparison, the above substances were applied to the structure shown in FIGS. 1 and 2, and a suitable voltage (e.g. 50 V) was applied to auxiliary electrode 4a in the same direction as the voltage applied between the anode and the cathodes. An injection effect derived from such a bias voltage overcame the counter result derived from the difference in work function, causing electrons to be injected from the cathodes into the light-emitting material layer. As a result, holes and electrons were recombined in the light-emitting material layer, resulting in light emission.

In a conventional structure, AlLi or similar substance with a small work coefficient, i.e., highly corrosive must be used for cathodes, so that the emission characteristic easily deteriorates due to the corrosion of the cathodes. By contrast, Example 1 allows Au or similar material with high corrosion resistance to be applied to the cathodes and thereby enhances the reliability of the light-emitting device.

EXAMPLE 2

In Example 2, the light-emitting material layer has a work function greater than the work function of its part contacting the cathodes. More specifically, the light-emitting body shown in FIGS. 8 and 9 was produced by use of specific substances listed in FIG. 36. Assume that the anode, light-emitting material layer and cathodes are sequentially stacked on the substrate in this order. Then, ITO forming the anode has a greater work function than a benzoquinolyl beryllium complex forming the light-emitting material layer, so that holes are injected from the anode into the light-emitting material layer. Also, Al forming the cathodes has a smaller work function than the benzoquinolyl beryllium complex. Therefore, electrons were injected from Al into the benzoquinolyl beryllium complex when a low voltage, e.g., 5 V was applied between the anode and the cathodes. This recombined electrons and holes in the benzoquinolyl beryllium complex and brought about light emission. However, because the work function of Al was not noticeably smaller than the work function of the benzoquinolyl beryllium complex, the complex had enough holes, but had short electrons. As a result, the recombination of electrons and holes was obstructed, limiting the luminance of emission.

For comparison, the above substances were applied to the structure shown in FIGS. 1 and 2, and a suitable voltage (e.g. 50 V) was applied to auxiliary electrode 4a in the same direction as the voltage applied between the anode and the cathodes. An injection effect derived from such a bias voltage made up for the small difference in work coefficient, allowing many electrons to be injected from the cathodes into the anode. This successfully promoted the hole and electron recombination and thereby increased luminance.

EXAMPLE 3

In Example 3, the light-emitting material layer has a greater work function than the anode. More specifically, the light-emitting body shown in FIG. 21 was produced by use of specific substances listed in FIG. 37. Assume that the anodes, light-emitting material layer and cathode are sequentially stacked on the substrate in this order. Then, AlLi forming the cathode has a smaller work function than a benzoquinolyl beryllium complex forming the light-emitting material layer, causing electrons to be injected from the cathode into the light-emitting material layer. However, the work function of Al is far smaller than the work function of the benzoquinolyl beryllium complex. Therefore, even when a low voltage., e.g., 5 V was applied between the anodes and the cathode, holes were not injected from Al into the complex. This prevented electrons and holes from being recombined in the complex and thereby obviated light emission.

For comparison, the above substances were applied to the structure shown in FIG. 15, and a suitable voltage (e.g. 50 V) was applied to auxiliary electrode 4a in the same direction as the voltage applied between the anodes and the cathode. An injection effect derived from such a bias voltage overcame the counter effect derived from the difference in work function, causing holes to be injected from the cathode into the light-emitting material layer. Consequently, electrons and holes were recombined in the light-emitting material layer and brought about light emission.

EXAMPLE 4

In Example 3, the light-emitting material layer had a greater work function than the anode. More specifically, the light-emitting body shown in FIG. 21 was produced by use of specific substances listed in FIG. 38. Assume that the anodes, light-emitting material layer and cathode are sequentially stacked on the substrate in this order. Then, ITO forming the anodes has a greater work function than copper phthalocyanine forming the light-emitting material layer, causing holes to be injected from the anodes into the light-emitting material layer. Also, the work function of AlLi forming the cathode is smaller than the work function of copper phthalocyanine. Therefore, even when a low voltage, e.g., 5 V was applied between the anodes and the cathode, electrons were not injected from AlLi into copper phthalocyanine. Consequently, electrons and holes are combined in copper phthalocyanine, resulting in light emission. However, the work function of ITO is not noticeably smaller than the work function of. As a result, copper phthalocyanine has enough electrons, but short holes. This obstructs the recombination of electrons and holes and thereby limits the luminance of emission.

For comparison, the above substances were applied to the structure shown in FIG. 15, and a suitable voltage (e.g. 50 V) was applied to auxiliary electrode 4a in the same direction as the voltage applied between the anodes and the cathode. An injection effect derived from such a bias voltage made up for the small difference in work function and allowed many holes to be injected from the anodes into the light-emitting material layer. This successfully promoted the recombination of electrons and holes in the light-emitting material layer and thereby increased luminance.

In summary, it will be seen that the present invention provides a light-emitting body, a light-emitting device and a light-emitting display having various unprecedented advantages, as enumerated below.

(1) Even if part of a light-emitting material layer contacting an anode has a work function equal to or greater than that of the anode, the light-emitting device allows holes to be injected from the anode into the light-emitting material layer. Such injection is effected more efficiently if the work function of the light-emitting material layer is smaller than the work function of the anode.

(2) Even if a cathode has a work function equal to or greater than the work function of part of the light-emitting material layer contacting the cathode, the light-emitting device allows electrons to be injected from the cathode into the light-emitting material layer. Such injection is effected more efficiently if the work function of the light-emitting material layer is greater than the work function of part of the light-emitting material layer contacting the cathode.

(3) The above advantages (1) and (2) allow the quantity of light to issue from the light-emitting material layer and broadens the range of materials applicable to the light-emitting material layer and cathode. It is therefore possible to use a highly corrosion resistant material for the cathode and therefore to extend the life of the light-emitting device.

Various modifications will become possible for those skilled in the art after receiving the teachings of the present disclosure without departing from the scope thereof.

What is claimed is:

1. An active matrix display, comprising:
   a substrate;
   a thin-film transistor comprising a semiconductor layer, a gate, a source, and a drain on the substrate; and
   a light-emitting body, comprising:
      an anode layer electrically connected to one of said source and said drain;
      a light-emitting material layer disposed on said anode layer;
      a cathode layer disposed on said light-emitting material layer;
      an insulation layer disposed on said cathode layer and said light-emitting material layer; and
      an auxiliary electrode disposed on said insulation layer.

2. The active matrix display of claim 1, wherein said light-emitting material layer comprises one of a single layer and a laminate, said laminate comprising at least a light-emitting layer.

3. An active matrix display, comprising:
   a substrate;
   a thin-film transistor comprising a semiconductor layer, a gate, a source, and a drain on the substrate; and
   a light-emitting body, comprising:
      a cathode layer electrically connected to one of said source and said drain;
      a light-emitting material layer disposed on said cathode layer;
      an anode layer disposed on said light-emitting material layer;
      an insulation layer disposed on said anode layer and said light-emitting material layer; and
      an auxiliary electrode disposed on said insulation layer.

4. The active matrix display of claim 3, wherein said light-emitting material layer comprises one of a single layer and a laminate, said laminate comprising at least a light-emitting layer.

5. An active matrix display, comprising:
   a substrate;
   a thin-film transistor comprising a semiconductor layer, a gate, a source, and a drain on the substrate; and
   a light-emitting body, comprising:
      an auxiliary electrode;
      an insulation layer disposed on said auxiliary electrode;
      a cathode disposed on said insulation layer;
      a light-emitting material layer disposed on said insulation layer and said cathode; and
      an anode layer disposed on said light-emitting material layer.

6. The active matrix display of claim 5, wherein said light-emitting material layer comprises one of a single layer and a laminate, said laminate comprising at least a light-emitting layer.

7. An active matrix display, comprising:
   a substrate;
   a thin-film transistor comprising a semiconductor layer, a gate, a source, and a drain on the substrate; and
   a light-emitting body, comprising:
      an auxiliary electrode;
      an insulation layer disposed on said auxiliary electrode;

an anode disposed on said insulation layer;

a light-emitting material layer disposed on said insulation layer and said anode; and a cathode layer disposed on said light-emitting material layer.

8. The active matrix display of claim 7, wherein said light-emitting material layer comprises one of a single layer and a laminate, said laminate comprising at least a light-emitting layer.

* * * * *